(12) United States Patent
Honda et al.

(10) Patent No.: US 12,341,479 B2
(45) Date of Patent: Jun. 24, 2025

(54) POWER AMPLIFYING CIRCUIT

(71) Applicant: Murata Manufacturing Co., Ltd., Kyoto (JP)

(72) Inventors: Yuri Honda, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 751 days.

(21) Appl. No.: 17/464,741

(22) Filed: Sep. 2, 2021

(65) Prior Publication Data

US 2022/0077828 A1 Mar. 10, 2022

(30) Foreign Application Priority Data

Sep. 4, 2020 (JP) .................. 2020-149392

(51) Int. Cl.
| | | |
|---|---|---|
| *H03F 3/45* | (2006.01) | |
| *H03F 1/02* | (2006.01) | |
| *H03F 3/193* | (2006.01) | |
| *H03F 3/21* | (2006.01) | |
| *H03F 3/30* | (2006.01) | |

(52) U.S. Cl.
CPC ............. *H03F 3/21* (2013.01); *H03F 1/0288* (2013.01); *H03F 3/193* (2013.01); *H03F 3/3098* (2013.01); *H03F 2200/451* (2013.01); *H03F 2200/541* (2013.01)

(58) Field of Classification Search
CPC .......... H03F 3/21; H03F 1/0288; H03F 3/193; H03F 3/3098; H03F 2200/451; H03F 2200/541; H03F 3/211; H03F 1/02; H03F 3/45071

USPC ......................................................... 330/253
See application file for complete search history.

(56) References Cited

U.S. PATENT DOCUMENTS

| 6,275,687 B1* | 8/2001 | Lloyd ...................... H04B 1/28 |
| | | 330/296 |
| 9,584,076 B2* | 2/2017 | Ortiz ..................... H03F 1/0205 |
| 10,411,662 B2 | 9/2019 | Lyalin et al. |
| 2009/0195324 A1 | 8/2009 | Li et al. |
| 2011/0221528 A1 | 9/2011 | An et al. |
| 2019/0296703 A1* | 9/2019 | Ortiz ....................... H03F 3/193 |

FOREIGN PATENT DOCUMENTS

CN 210246699 U 4/2020

* cited by examiner

*Primary Examiner* — Andrea Lindgren Baltzell
*Assistant Examiner* — Khiem D Nguyen
(74) *Attorney, Agent, or Firm* — McDonald Hopkins LLC

(57) ABSTRACT

A power amplifying circuit includes a first amplifier, a second amplifier, a transformer having a primary winding and a secondary winding, and a capacitor. The first amplifier amplifies a signal which is one of differential signals. The second amplifier amplifies a signal which is the other of the differential signals. The primary winding is connected, at its first end, to the first amplifier, and is connected, at its second end, to the second amplifier. The secondary winding is connected, at its first end, to an unbalanced line through which an unbalanced signal is transmitted, and is connected, at its second end, to the ground. The secondary winding is electromagnetically coupled to the primary winding. The capacitor is connected, at its first end, to the midpoint of the primary winding, and is connected, at its second end, to the ground.

6 Claims, 21 Drawing Sheets

FIG. 8
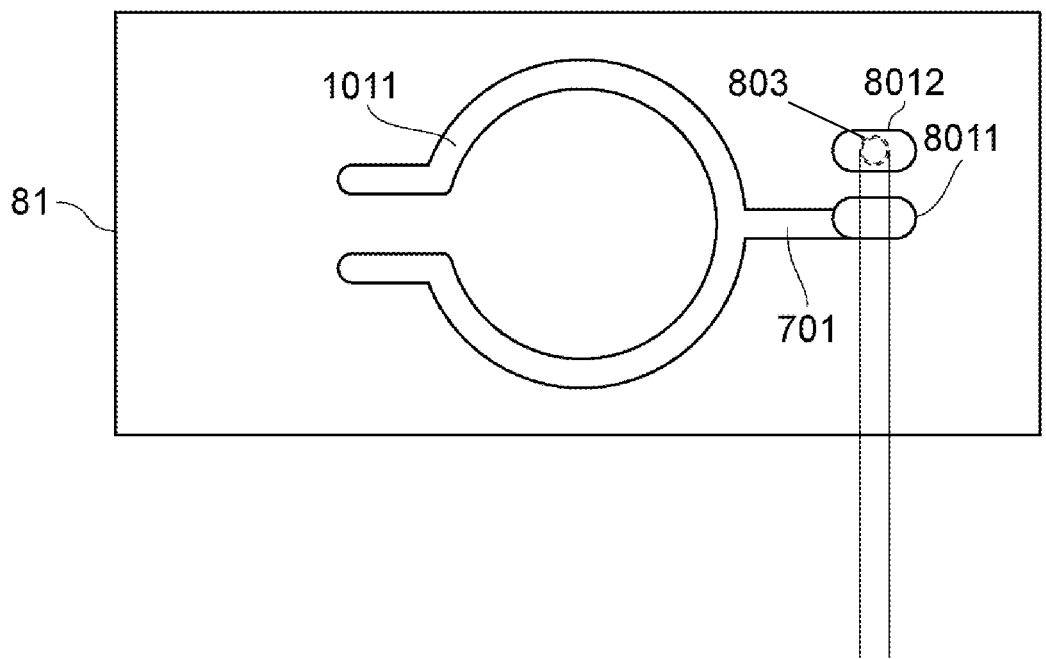
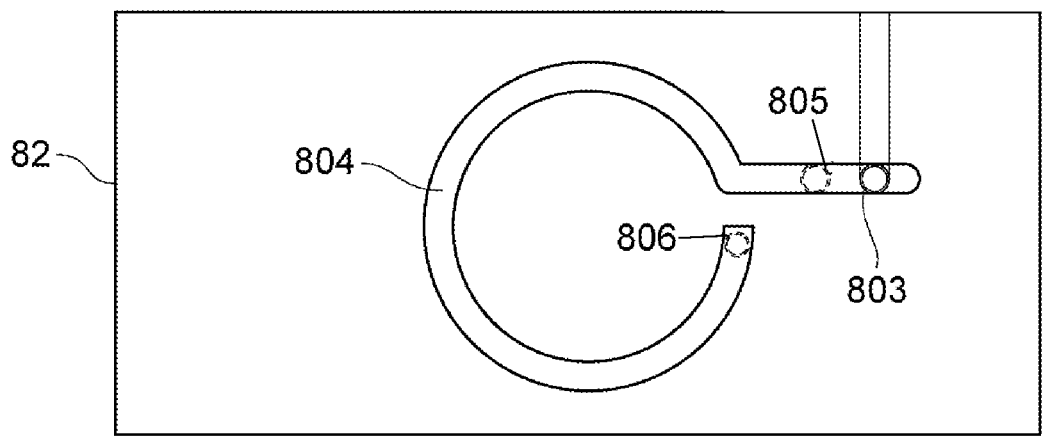

POWER AMPLIFYING CIRCUIT

CROSS REFERENCE TO RELATED APPLICATION

This application claims priority from Japanese Patent Application No. 2020-149392 filed on Sep. 4, 2020. The content of this application is incorporated herein by reference in its entirety.

BACKGROUND OF THE DISCLOSURE

1. Field of the Disclosure

The present disclosure relates to a power amplifying circuit.

2. Description of the Related Art

In communication using mobile units such as a cellular phone, power amplifying circuits, which amplify radio frequency (RF) signals, are used. Higher efficiency is required for power amplifying circuits. To achieve higher efficiency in power amplifying circuits, a power amplifying circuit, which performs amplification using differential signals, is used.

U.S. Pat. No. 10,411,662 describes a power amplifying circuit using a transformer to combine differential signals which have been amplified by amplifiers. In the power amplifying circuit described in U.S. Pat. No. 10,411,662, the primary winding of the transformer receives differential signals from two amplifiers, and a signal, which is obtained by combining the differential signals, is outputted from the secondary winding.

In a power amplifying circuit using a transformer, parasitic capacitance, which occurs between the primary winding and the secondary winding of the transformer, causes a shift (imbalance) from the ideal phase difference and amplitude difference between differential signals. In the power amplifying circuit described in U.S. Pat. No. 10,411,662, the secondary winding of the transformer, which combines differential signals, is connected, at its end, to the ground through a capacitor. This capacitor thus disposed may cause the decrease of the difference between the potential difference, which is produced between the primary winding and the secondary winding at one end of the secondary winding, and the potential difference, which is produced at the other end. The decrease of the difference between the potential differences causes the decrease of the imbalance which occurs due to the parasitic capacitance.

In contrast, this capacitor thus disposed causes a change of the load impedance at the fundamental frequency, which is seen from each of the amplifiers, which serve as a differential pair, to the load. The impedance seen from one of the amplifiers to the load is different from that seen from the other because a capacitor is disposed at one end of the secondary winding. When the load impedance seen from one of the amplifiers is different from that seen from the other, an imbalance remains in differential signals received by the transformer. When differential signals have an imbalance, the power efficiency of an output signal, which is obtained by combining the differential signals, is decreased.

BRIEF SUMMARY OF THE DISCLOSURE

The present disclosure is made in view of this issue, and an object thereof is to provide a highly efficient power amplifying circuit which amplifies power by using a differential configuration.

A power amplifying circuit according to an aspect of the present disclosure includes a first amplifier, a second amplifier, a transformer, and a capacitance element. The first amplifier amplifies a first signal of differential signals. The second amplifier amplifies a second signal of the differential signals. The transformer has a first winding and a second winding. The first winding has a first end connected to the first amplifier and has a second end connected to the second amplifier. The second winding has a first end connected to an unbalanced line, through which an unbalanced signal is transmitted, and has a second end connected to the ground. The second winding is electromagnetically coupled to the first winding. The capacitance element has a first end connected to the midpoint of the first winding, and has a second end connected to the ground. Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 8 is a diagram illustrating a layout of a transformer in the power amplifying circuit according to the third embodiment;

DETAILED DESCRIPTION OF THE DISCLOSURE

Figure 1:
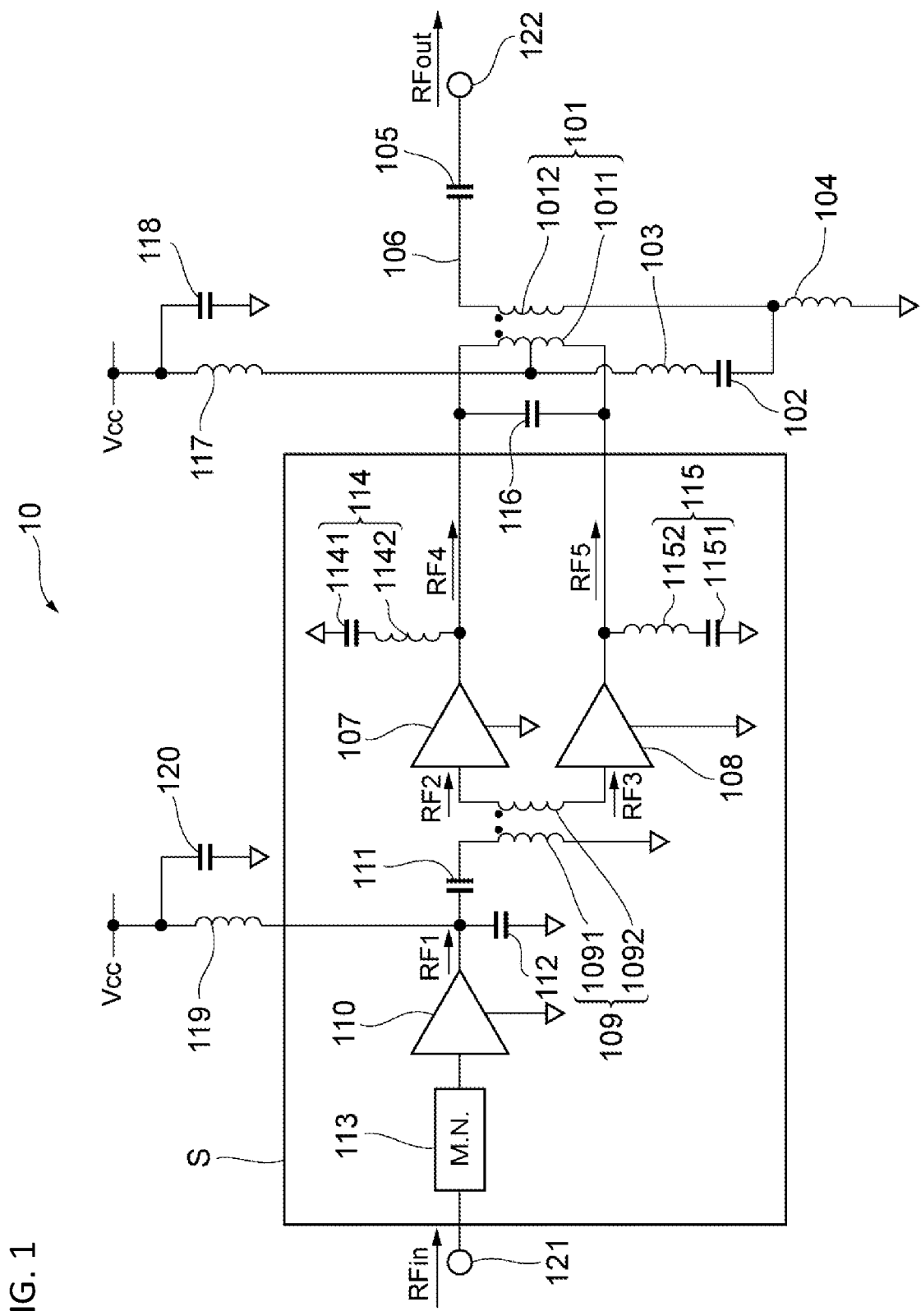
FIG. 1 is a circuit diagram illustrating a power amplifying circuit according to a first embodiment.

Embodiments of the present disclosure will be described in detail below by referring to the drawings. Identical components are designated with identical reference characters, and repeated description will be avoided as much as possible.

A first embodiment will be described. FIG. 1 is a circuit diagram of a power amplifying circuit 10 according to the first embodiment. The power amplifying circuit 10 includes a transformer 101, capacitors 102, 105, 111, 116, 118, and 120, inductors 103, 104, 117, and 119, amplifiers 107, 108, and 110, a matching circuit 113, and termination circuits 114 and 115.

The transformer 101 has a primary winding 1011 (first winding) and a secondary winding 1012 (second winding). The primary winding 1011 is electromagnetically coupled to the secondary winding 1012. The primary winding 1011 is connected, at its first end, to the output of the amplifier 107, and is connected, at its second end, to the output of the amplifier 108. The secondary winding 1012 is connected, at its first end, through an unbalanced line 106 and the capacitor 105 to an output end 122, and is connected, at its second end, through the inductor 104 to the ground.

The primary winding 1011 receives, at its first end, one of differential signals from the amplifier 107, and receives, at its second end, the other differential signal from the amplifier 108. The transformer 101 performs a balanced-unbalanced transform on differential signals received by the primary winding 1011. A signal, which is obtained through conversion into an unbalanced signal performed by the transformer 101, is outputted through the unbalanced line 106 and the capacitor 105 to the output end 122.

The capacitor 102 is connected, at its second end, through the inductor 104 to the ground. The capacitor 102 is connected, at its second end, to the second end of the secondary winding 1012.

The inductor 103 is connected, at its first end, to the midpoint of the primary winding 1011, and is connected, at its second end, to the first end of the capacitor 102. The midpoint in the present disclosure allows a shift, which is caused by an error, of about ±15% from the center of the primary winding 1011.

The inductor 104 is an inductance produced by a via, for connection to the ground, included in a substrate (not illustrated) having the transformer 101.

The capacitor 105 is disposed between the secondary winding 1012 and the output end 122. The capacitor 105 is disposed so that, when the secondary winding 1012 is seen from the output end 122, the impedance of the direct-current component is seen as being open.

The unbalanced line 106 is a wire connected to the first end of the secondary winding 1012. A signal, which is obtained through a combining operation performed by the transformer 101, is transmitted through the unbalanced line 106.

The amplifier 107 (first amplifier) is connected, at its input, to a first end of a secondary winding 1092 of a transformer 109, and is connected, at its output, to the first end of the primary winding 1011 of the transformer 101. The amplifier 107 amplifies a signal RF2 from the transformer 109, and outputs a signal RF4.

The amplifier 108 (second amplifier) is connected, at its input, to a second end of the secondary winding 1092 of the transformer 109, and is connected, at its output, to the second end of the primary winding 1011 of the transformer 101. The amplifier 108 amplifies a signal RF3 from the transformer 109, and outputs a signal RF5.

The transformer 109 has a primary winding 1091 and the secondary winding 1092. The primary winding 1091 is electromagnetically coupled to the secondary winding 1092. The primary winding 1091 is connected, at its first end, through the capacitor 111 to the output of the amplifier 110, and is connected, at its second end, to the ground.

The primary winding 1091 receives a signal RF1 obtained through amplification performed by the amplifier 110. The transformer 109 performs an unbalanced-balanced transform on an unbalanced signal received through an unbalanced line (not illustrated) from the amplifier 110. In accordance with a signal received by the primary winding 1091, a signal RF2 is outputted from the first end of the secondary winding 1092, and a signal RF3 is outputted from the second end of the secondary winding 1092. The signal RF2 is substantially opposite in phase to the signal RF3.

The amplifier 110 (third amplifier) amplifies an input signal RFin received through an input end 121 and the matching circuit 113. The amplifier 110 outputs a signal RF1 through the capacitor 111 to the transformer 109. The capacitor 111 is disposed to cut the direct-current component of a signal RF1. The amplifier 110 is connected, at its output, through a capacitor 112 to the ground. The capacitor 112 is disposed to adjust the impedance seen from the amplifier 110 to the transformer 109.

The amplifiers 107, 108, and 110 include, for example, transistors such as a heterojunction bipolar transistor (HBT). Alternatively, the amplifiers 107, 108, and 110 may include field-effect transistors.

The matching circuit 113 is disposed to adjust the impedance between the input end 121 and the input of the amplifier 110.

The termination circuit 114 is disposed between the output of the amplifier 107 and the first end of the primary winding 1011. The termination circuit 114 has a capacitor 1141 and an inductor 1142, and is disposed to terminate harmonic components of an output signal from the amplifier 107. The termination circuit 115 is disposed between the output of the amplifier 108 and the second end of the primary winding 1011. The termination circuit 115 has a capacitor 1151 and an inductor 1152, and is disposed to terminate harmonic components of an output signal from the amplifier 108. For example, the values of the capacitor 1141 and the inductor 1142 are determined so that the frequency is set to integer multiples of a signal that is to be amplified by the amplifier 107. Similarly, the values of the capacitor 1151 and the inductor 1152 are determined so that the frequency is set to integer multiples of a signal that is to be amplified by the amplifier 108.

The capacitor 116 is disposed to connect the first end to the second end of the primary winding 1011, and is connected to the output of the amplifier 107 and the output of the amplifier 108. The capacitor 116 is disposed to adjust the impedance seen from the output of the amplifier 107 to the transformer 101 and that seen from the output of the amplifier 108.

The amplifiers 107, 108, and 110, the transformer 109, the capacitors 111 and 112, the matching circuit 113, and the termination circuits 114 and 115 are disposed on or in a semiconductor substrate S. The semiconductor substrate S is grounded through the ground for a substrate having the power amplifying circuit 10.

The inductor 117 is supplied, at its first end, with the power supply voltage Vcc, and is connected, at its second end, to the midpoint of the primary winding 1011. The power supply voltage Vcc is supplied through the inductor 117 and the primary winding 1011 to the amplifier 107 and the amplifier 108. The capacitor 118 is disposed between the inductor 117 and the ground, and has a function of flowing the alternate-current component to the ground.

The inductor 119 is supplied, at its first end, with the power supply voltage Vcc, and is connected, at its second end, to the amplifier 110. The power supply voltage Vcc is supplied through the inductor 119 to the amplifier 110. The capacitor 120 is disposed between the inductor 119 and the ground, and has a function of flowing the alternate-current component to the ground.

The power amplifying circuit 10 converts a signal RF1, which is obtained by the amplifier 110 amplifying an input signal RFin received from the input end 121, to differential signals by using the transformer 109. The differential signals obtained through the conversion are amplified by the amplifier 107 and the amplifier 108, respectively. The differential signals from the amplifier 107 and the amplifier 108 are combined by the transformer 101, and the resulting signal is outputted as an output signal RFout from the output end 122. The power amplifying circuit 10 performs differential amplification.

Figure 18:
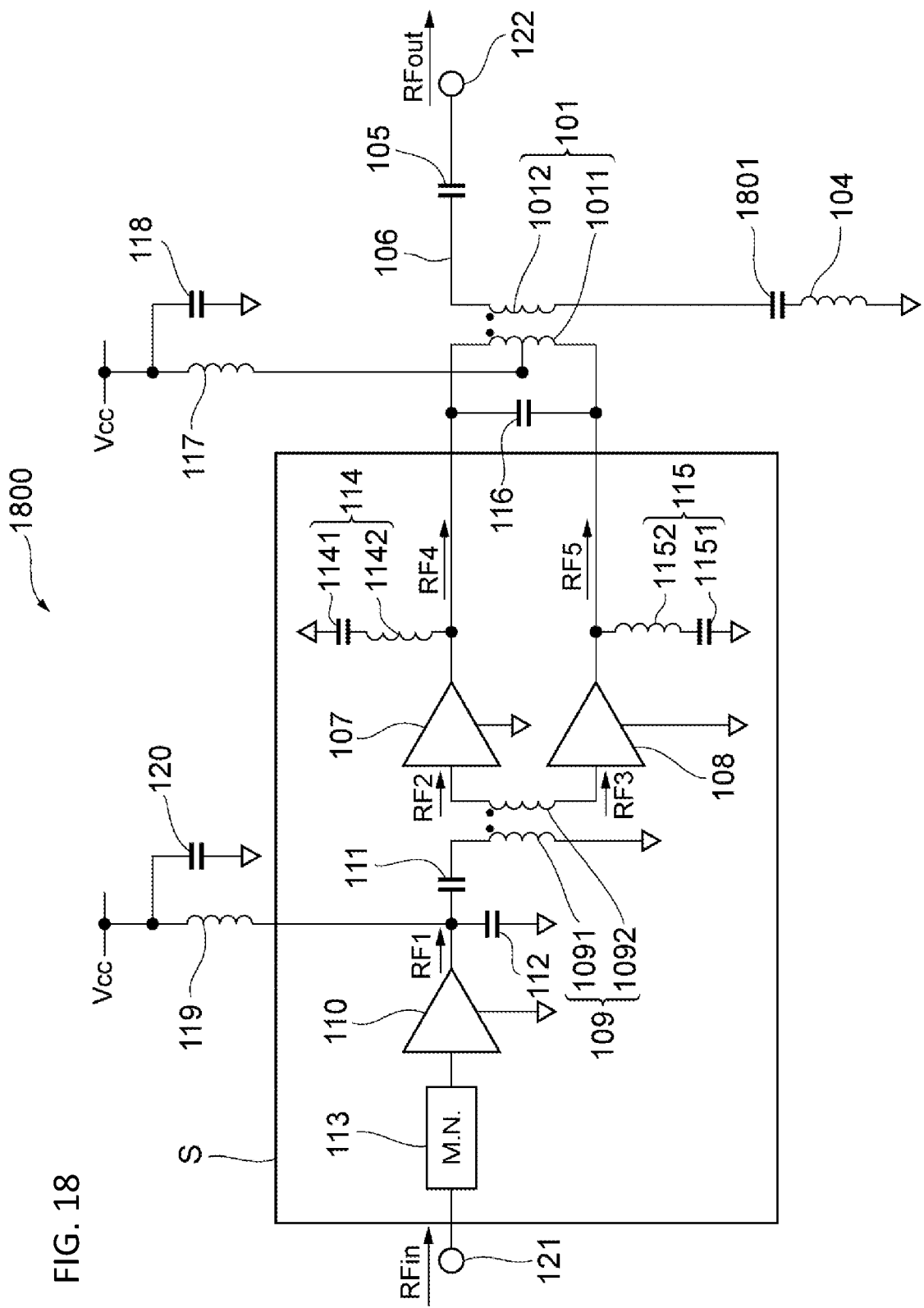
FIG. 18 is a circuit diagram illustrating a power amplifying circuit according to a reference example.

The characteristics of the power amplifying circuit 10 will be described by referring to a power amplifying circuit 1800 in FIG. 18. FIG. 18 is a circuit diagram of the power amplifying circuit 1800 serving as a reference example. The power amplifying circuit 1800 is different from the power amplifying circuit 10 in that the primary winding 1011 is not connected to the ground through the inductor 103 and the capacitor 102 and in that the secondary winding 1012 is connected to the ground through a capacitor 1801 and the inductor 104.

Figure 2:
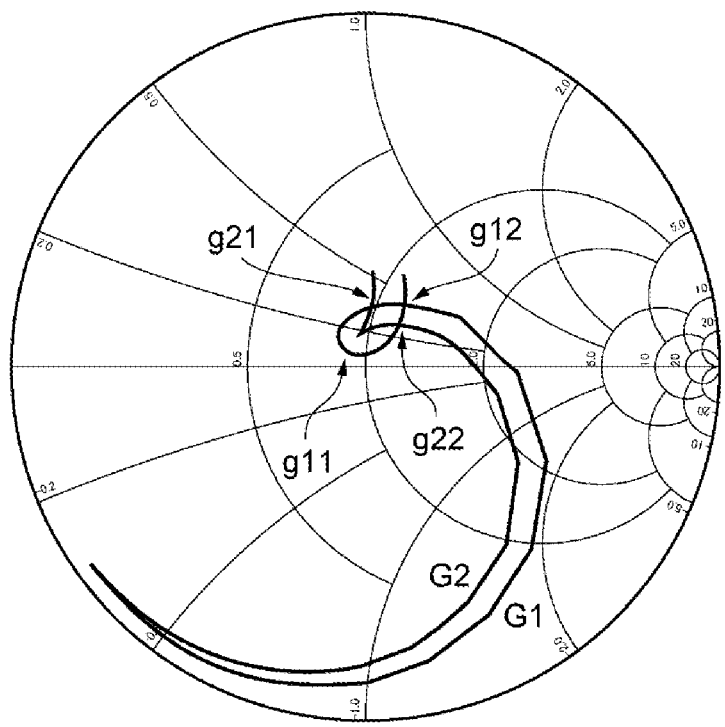
FIG. 2 is a diagram illustrating load impedance for amplifiers in the power amplifying circuit according to the first embodiment.

The Smith chart in FIG. 2 illustrates curve G1 and curve G2. Curve G1 indicates the impedance seen from the amplifier 107 to the transformer 101 in the power amplifying circuit 10. Curve G2 indicates the impedance seen from the amplifier 108 to the transformer 101 in the power amplifying circuit 10. The track of the impedance on curve G1, which is obtained when the frequency of an input signal RFin is changed from about 1.7 GHZ to about 2.7 GHZ, is a clockwise track from position g11 to position g12. The track of the impedance in the same frequency range on curve G2 is a clockwise track from position g21 to position g22. In the simulation from FIG. 2 to FIG. 4, the inductance of the inductor 103 is about 0.3 nH, and the capacitance of the capacitor 102 is about 12 pF.

In FIG. 2, the difference between the track from position g11 to position g12 on curve G1 and the track from position g21 to position g22 on curve G2 indicates the difference between the impedance seen from the amplifier 107 to the transformer 101 and that from the amplifier 108.

Figure 19:
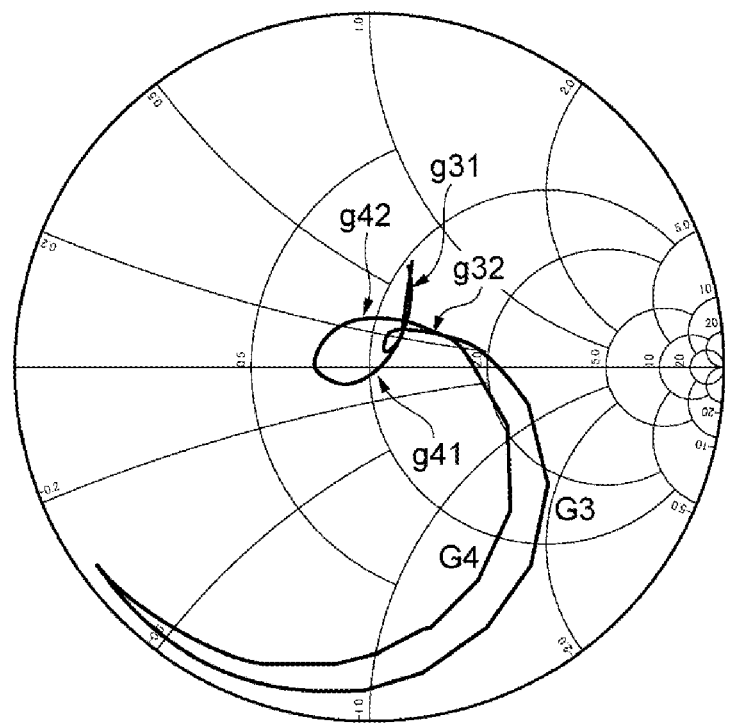
FIG. 19 is a diagram illustrating load impedance for amplifiers in the power amplifying circuit according to the reference example.

FIG. 19 illustrates a Smith chart obtained similarly in the power amplifying circuit 1800. The Smith chart in FIG. 19 illustrates curve G3 and curve G4. Curve G3 indicates the impedance seen from the amplifier 107 to the transformer 101. Curve G4 indicates the impedance seen from the amplifier 108 to the transformer 101. Like the case in FIG. 2, the tracks of the impedance, which are obtained when the frequency of an input signal RFin is changed, are a clockwise track from position g31 to position g32 on curve G3 and a clockwise track from position g41 to position g42 on curve G4.

In FIG. 19, the difference between the track from position g31 to position g32 on curve G3 and the track from position g41 to position g42 on curve G4 indicates the difference between the impedance seen from the amplifier 107 to the transformer 101 and that from the amplifier 108.

In the range of the frequency of an input signal RFin between about 1.7 GHZ and about 2.7 GHZ, when the difference in impedance in FIG. 2 is compared with that in FIG. 19, the difference in FIG. 2 is smaller. That is, the power amplifying circuit 10 may make the difference in impedance between the amplifier 107 and the amplifier 108 smaller than that of the power amplifying circuit 1800.

Figure 3:
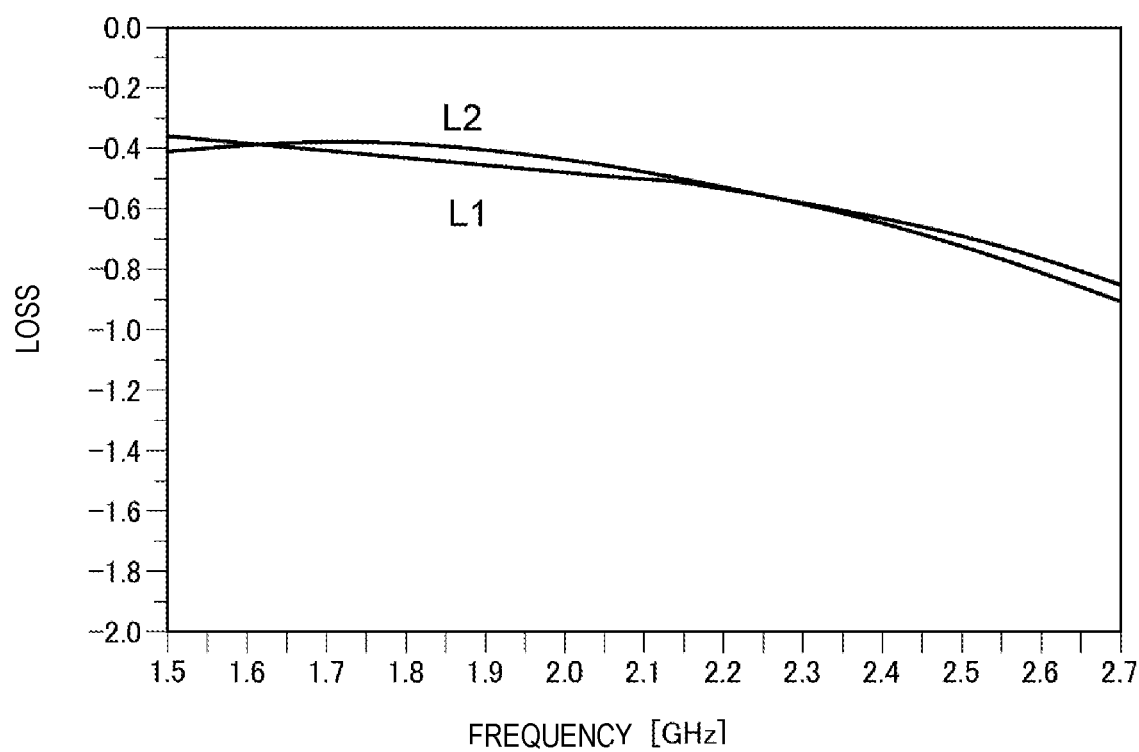
FIG. 3 is a diagram illustrating loss for amplifiers in the power amplifying circuit according to the first embodiment.
Figure 4:
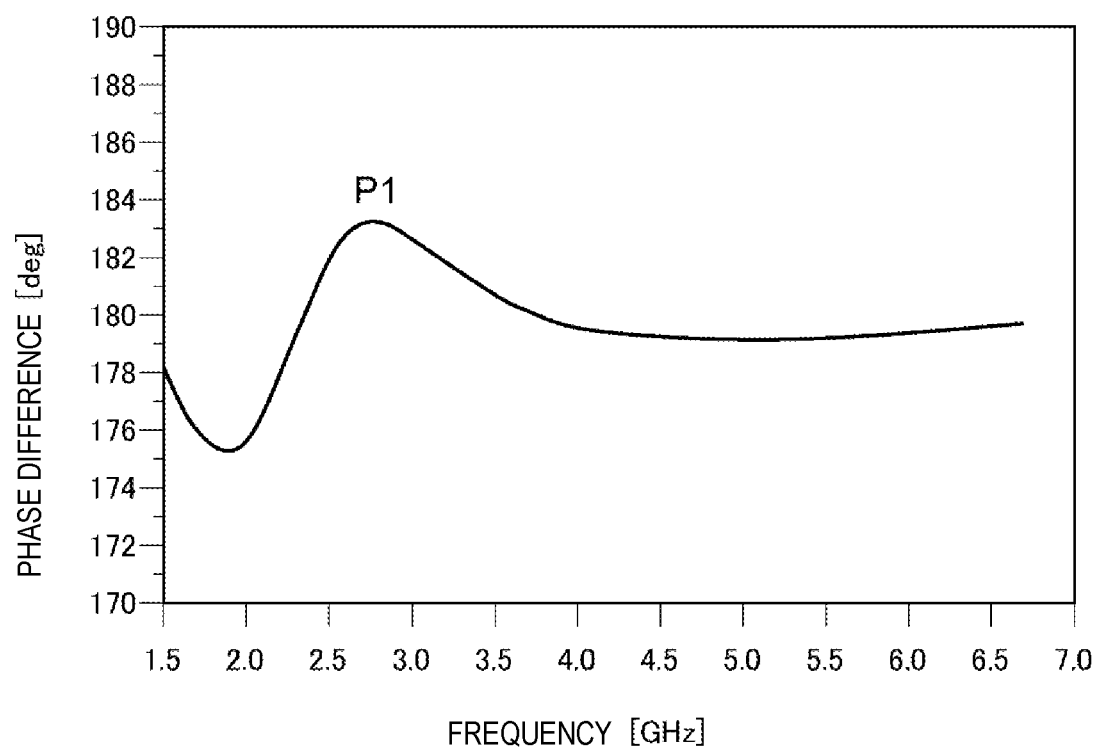
FIG. 4 is a diagram illustrating the phase difference between signals from amplifiers in the power amplifying circuit according to the first embodiment.

FIG. 3 illustrates curve L1 and curve L2. Curve L1 indicates loss between the output of the amplifier 107 and the output end 122 in the power amplifying circuit 10. Curve L2 indicates loss between the output of the amplifier 108 and the output end 122 in the power amplifying circuit 10. The horizontal axis in FIG. 4 represents the frequency of an input signal RFin.

Figure 20:
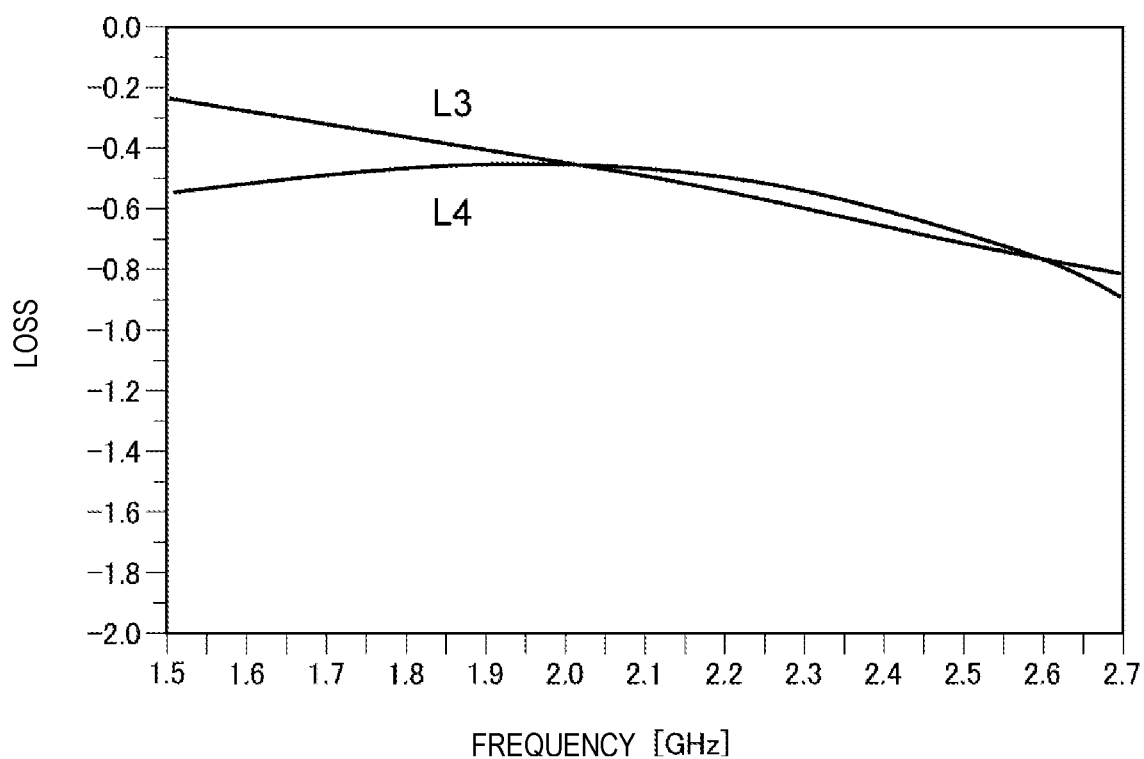
FIG. 20 is a diagram illustrating loss for amplifiers in the power amplifying circuit according to the reference example.

Like FIG. 3, FIG. 20 illustrates curve L3 and curve L4. Curve L3 indicates loss between the output of the amplifier 107 and the output end 122 in the power amplifying circuit 1800. Curve L4 indicates loss between the output of the amplifier 108 and the output end 122 in the power amplifying circuit 1800.

The loss between the output of the amplifier 107 and the output end 122 changes on the basis of the voltage and the current at the first end of the primary winding 1011 connected to the amplifier 107. The loss between the output of the amplifier 108 and the output end 122 changes on the basis of the voltage and the current at the second end of the primary winding 1011 connected to the amplifier 108. That is, the difference between the losses, which is indicated as the difference between curve L1 and curve L2, corresponds to the difference of the voltage and the current between the end points of the primary winding 1011. As the difference between the losses is smaller, the difference of the voltage and the current between the end points of the primary winding 1011, that is, the imbalance between the amplitudes of differential signals, is smaller. The same is true for the difference between curve L3 and curve L4.

In the range of the frequency between about 1.7 GHz and about 2.7 GHZ, the difference between curve L1 and curve L2 in FIG. 3 is smaller than that between curve L3 and curve L4 in FIG. 20. Therefore, the power amplifying circuit 10 may make the imbalance between the amplitudes of differential signals smaller than that of the power amplifying circuit 1800.

Figure 21:
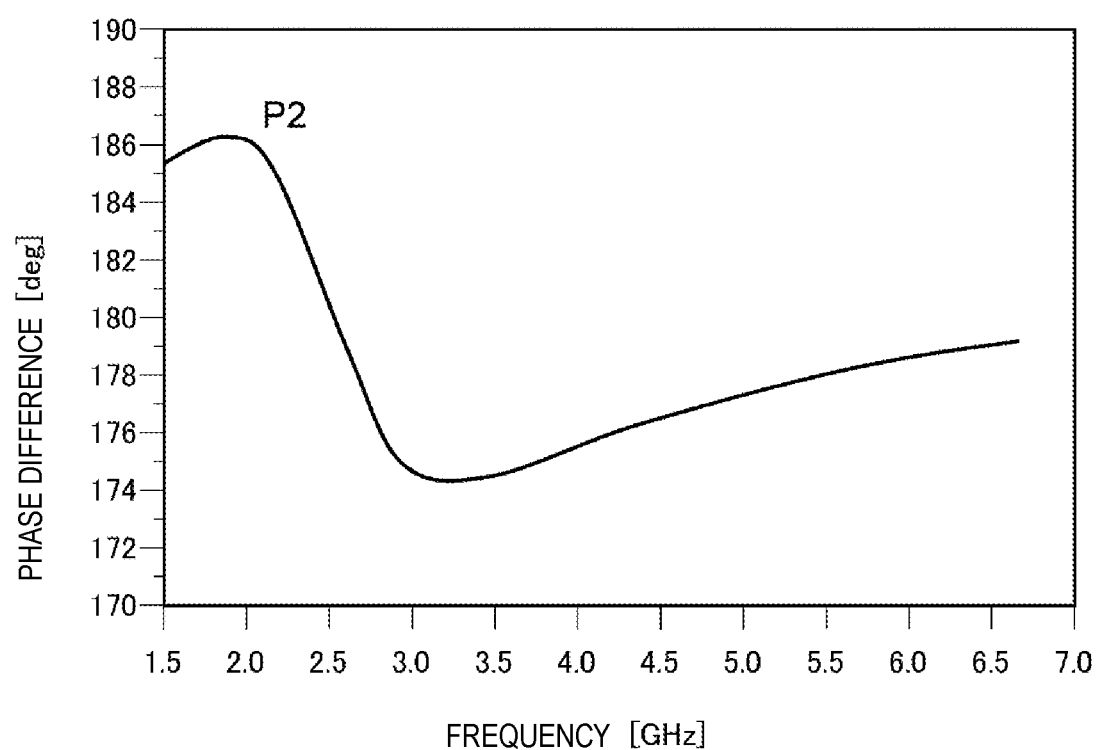
FIG. 21 is a diagram illustrating the phase difference between signals from amplifiers in the power amplifying circuit according to the reference example.

FIG. 4 illustrates the phase difference between a signal RF4 from the amplifier 107 and a signal RF5 from the amplifier 108 which is obtained in the power amplifying circuit 10 when an input signal RFin is changed. FIG. 21 illustrates the phase difference obtained similarly in the power amplifying circuit 1800.

In the range of the frequency between about 1.7 GHz and about 2.7 GHZ, in FIG. 4, the phase difference changes from about 183° to about 176°; in FIG. 21, the phase difference changes from about 186° to about 177°. That is, the power amplifying circuit 10 may make the phase difference closer to 180°, which is an ideal value, than that of the power amplifying circuit 1800.

The power amplifying circuit 10 may decrease the imbalance between the amplitudes, which is illustrated in FIG. 3, and decrease the imbalance in the phase difference, which is illustrated in FIG. 4, while the difference in impedance is made small as illustrated in FIG. 2.

In a transformer which combines differential signals ideally, odd-order signal components including the fundamental frequency component do not occur at the midpoint of the primary winding. This is because signals from the respective differential amplifiers cancel each other at the midpoint. That is, when the midpoint of the primary winding is seen from one of the differential amplifiers, a signal from the differential amplifier is seen as flowing to the ground. That is, for the odd-order signal components, the impedance seen from each differential amplifier to the transformer 101 is seen, through the primary winding 1011, as being virtually short. The expression, "being short", according to the embodiment of the present disclosure indicates that the real part on a Smith chart ranges substantially between 0 ohms and 5 ohms.

In contrast, in an actual transformer, parasitic capacitance between a primary winding and a secondary winding causes the impedance, which is seen from each of the differential amplifiers to the midpoint of the primary winding, to fall out of the short state. In the power amplifying circuit 10, the midpoint of the primary winding 1011 is AC grounded through the capacitor 102. The capacitance value of the capacitor 102 may be adjusted so that, for the fundamental frequency of an input signal RFin, the impedance seen from the output of the amplifier 107 and the output of the amplifier 108 through the primary winding 1011 to the midpoint of the primary winding 1011 is seen as being short.

Thus, the transformer 101 may reduce the imbalance between differential signals, enabling the power amplifying circuit 10 to perform more appropriate differential amplification. Further, as indicated in the comparison between FIGS. 2 and 19, the power amplifying circuit 10 achieves reduction of the imbalance without making the impedance from the amplifier 107 to the transformer 101 different from that from the amplifier 108 by a large amount.

In addition, the power amplifying circuit 10, which includes the inductor 103, enables reduction of the imbalance in a wider range of frequency than that in a power amplifying circuit in which, as described in a second embodiment, the primary winding 1011 is connected to the ground only through the capacitor 102.

The second embodiment will be described. In the second embodiment and its subsequent embodiments, points common to those in the first embodiment will not be described, and only different points will be described. In particular, substantially the same operational effects caused by substantially the same configurations will not be described in the subsequent embodiments.

Figure 5:
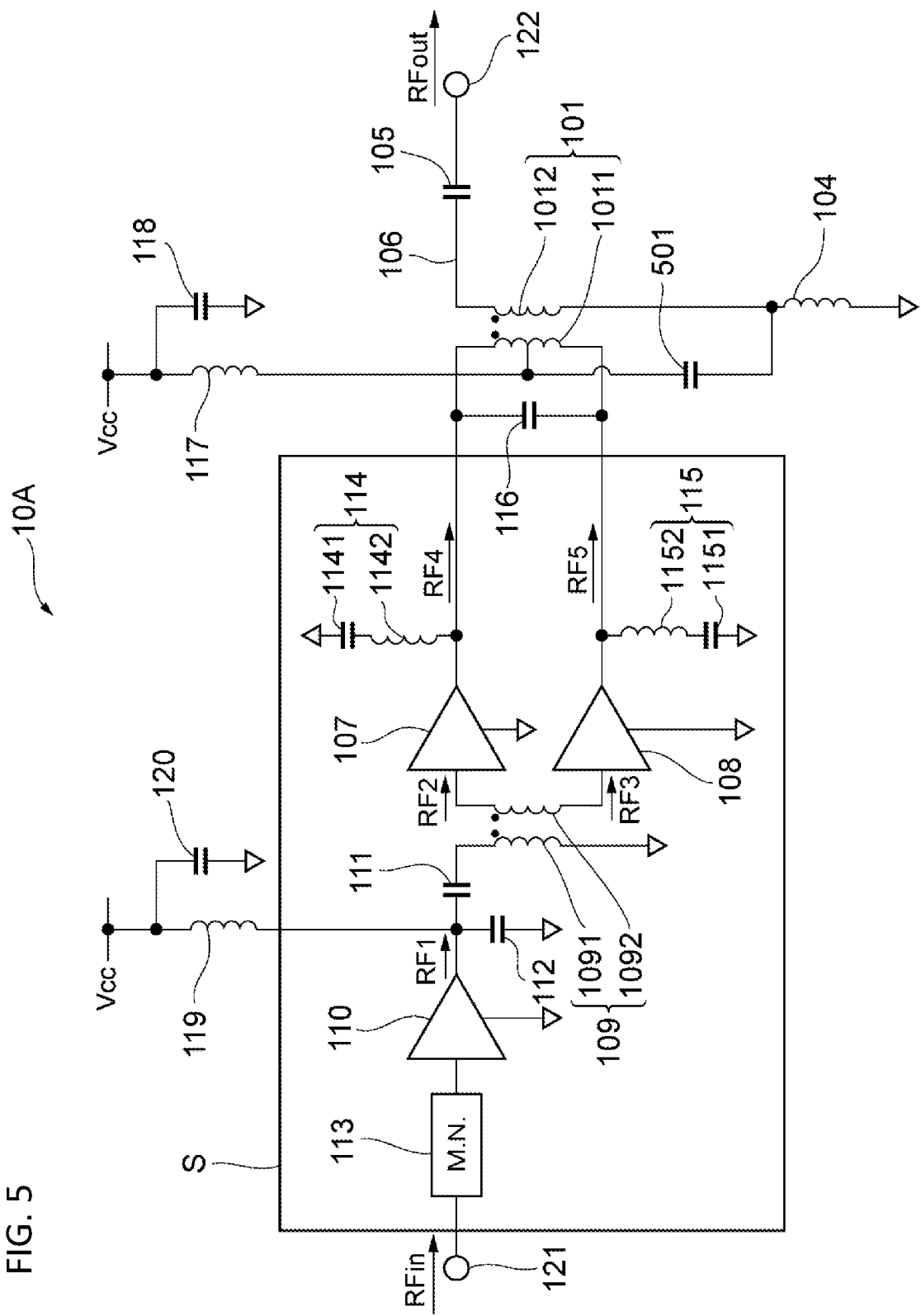
FIG. 5 is a circuit diagram illustrating a power amplifying circuit according to a second embodiment.

FIG. 5 is a circuit diagram illustrating a power amplifying circuit 10A according to the second embodiment. The power amplifying circuit 10A is different from the power amplifying circuit 10 in that the inductor 103 is not disposed between the primary winding 1011 and the ground, and in that a capacitor 501 is disposed between the primary winding 1011 and the ground.

Figure 6:
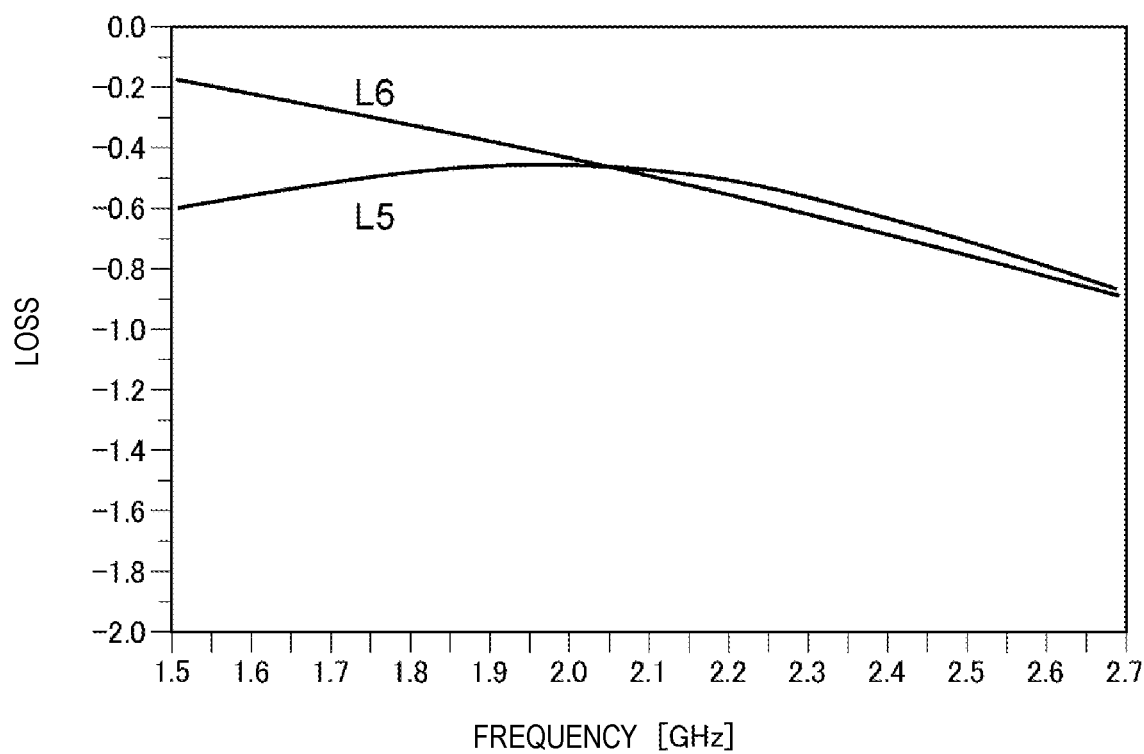
FIG. 6 is a diagram illustrating loss for amplifiers in the power amplifying circuit according to the second embodiment.

FIG. 6 illustrates losses in the power amplifying circuit 10A in the same manner as that in FIG. 3. FIG. 6 illustrates loss for the amplifier 107 as curve L5, and loss for the amplifier 108 as curve L6. Even when only the capacitor 501 is disposed to connect the primary winding 1011 to the ground, for example, the difference between the losses may be made small at frequencies at and near 2.0 GHZ.

Figure 7:
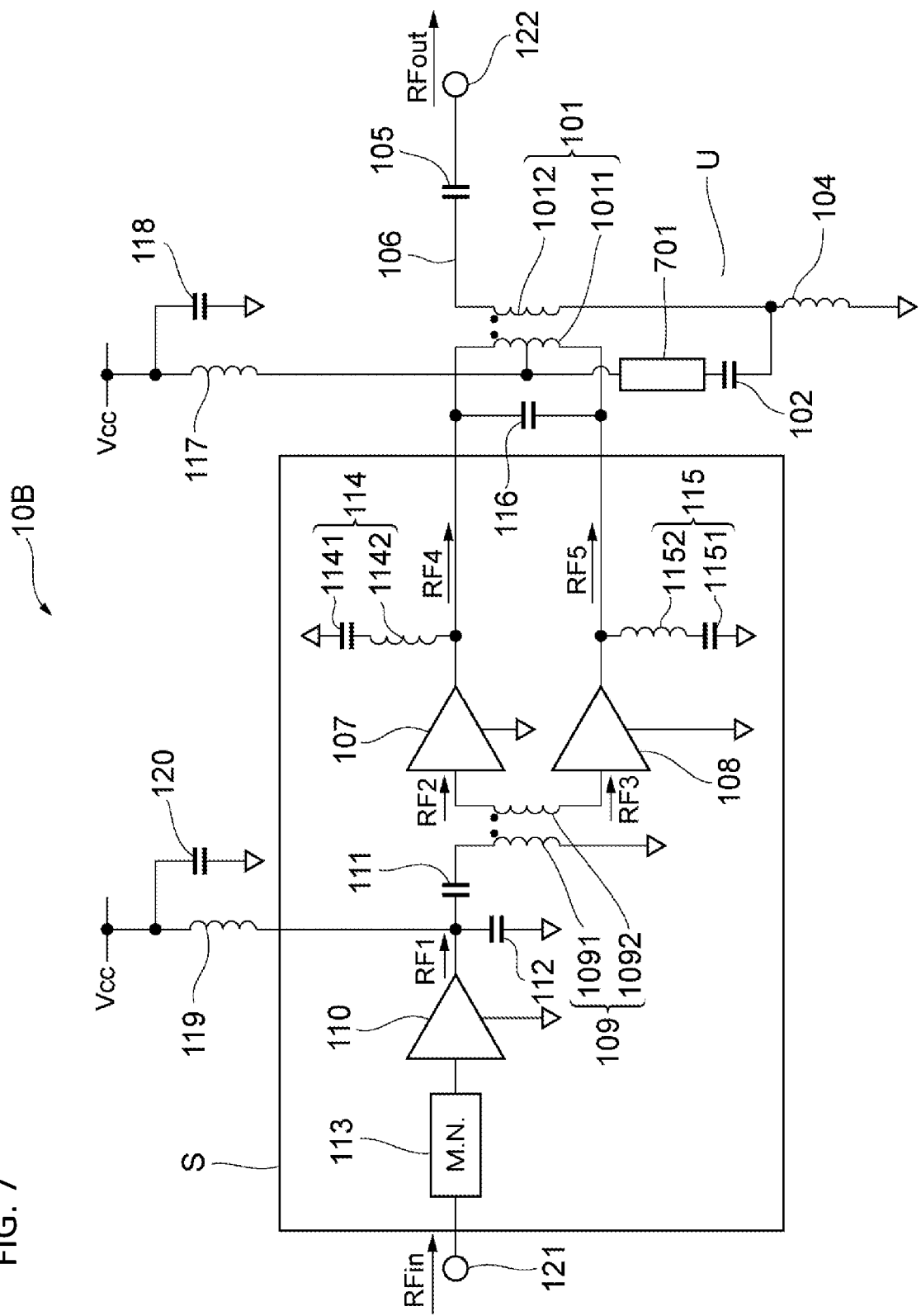
FIG. 7 is a circuit diagram illustrating a power amplifying circuit according to a third embodiment.

A third embodiment will be described. FIG. 7 is a circuit diagram illustrating a power amplifying circuit 10B according to the third embodiment. The power amplifying circuit 10B has a configuration in which the inductor 103 in the power amplifying circuit 10 is replaced with a line 701 which functions as an inductance element. Like the power amplifying circuit 10, the power amplifying circuit 10B may also reduce the imbalance between differential signals. In the power amplifying circuit 10B, the line 701 and the transformer 101 are disposed on and in a substrate U.

Layered structures of the substrate U in which the inductor 103 is formed by using the line 701 will be described by referring to FIGS. 8 to 12. In plan view of the substrate U, the substrate U has a multilayer body having a wiring layer 81 and a wiring layer 82 as illustrated in FIG. 8.

On the wiring layer 81 (first wiring layer), the primary winding 1011 (first conductive portion), the line 701, and electrodes 8011 and 8012, which are formed of conductors, are disposed. The line 701 is connected to the primary winding 1011 disposed in a partial-circle shape on the wiring layer 81. The line 701 is connected to the electrode 8011 (first electrode). The electrode 8012 (second electrode) is disposed so as to face the electrode 8011. The electrode 8012 is connected to the wiring layer 82 through a via 803 (first via). The capacitor 102 is mounted, for example, as a surface mount device on the electrode 8011 and the electrode 8012.

The wiring layer 82 (second wiring layer) is disposed so as to face the wiring layer 81. A conductive portion 804 (second conductive portion) is disposed on the wiring layer 82. The conductive portion 804 is a part of the secondary winding 1012 including the second end of the secondary winding 1012. In plan view of the substrate U, the conductive portion 804 is disposed so as to overlap the primary winding 1011 partially. Specifically, a part, in a partial-circle shape, of the conductive portion 804 overlaps the primary winding 1011.

The conductive portion 804 is connected to the capacitor 102 through the via 803. The conductive portion 804 is connected to the ground for the substrate U through a via 805 (second via). The conductive portion 804 is connected to a conductive portion, which is another part of the secondary winding 1012 disposed on another wiring layer (not illustrated), through a via 806.

Figure 9:
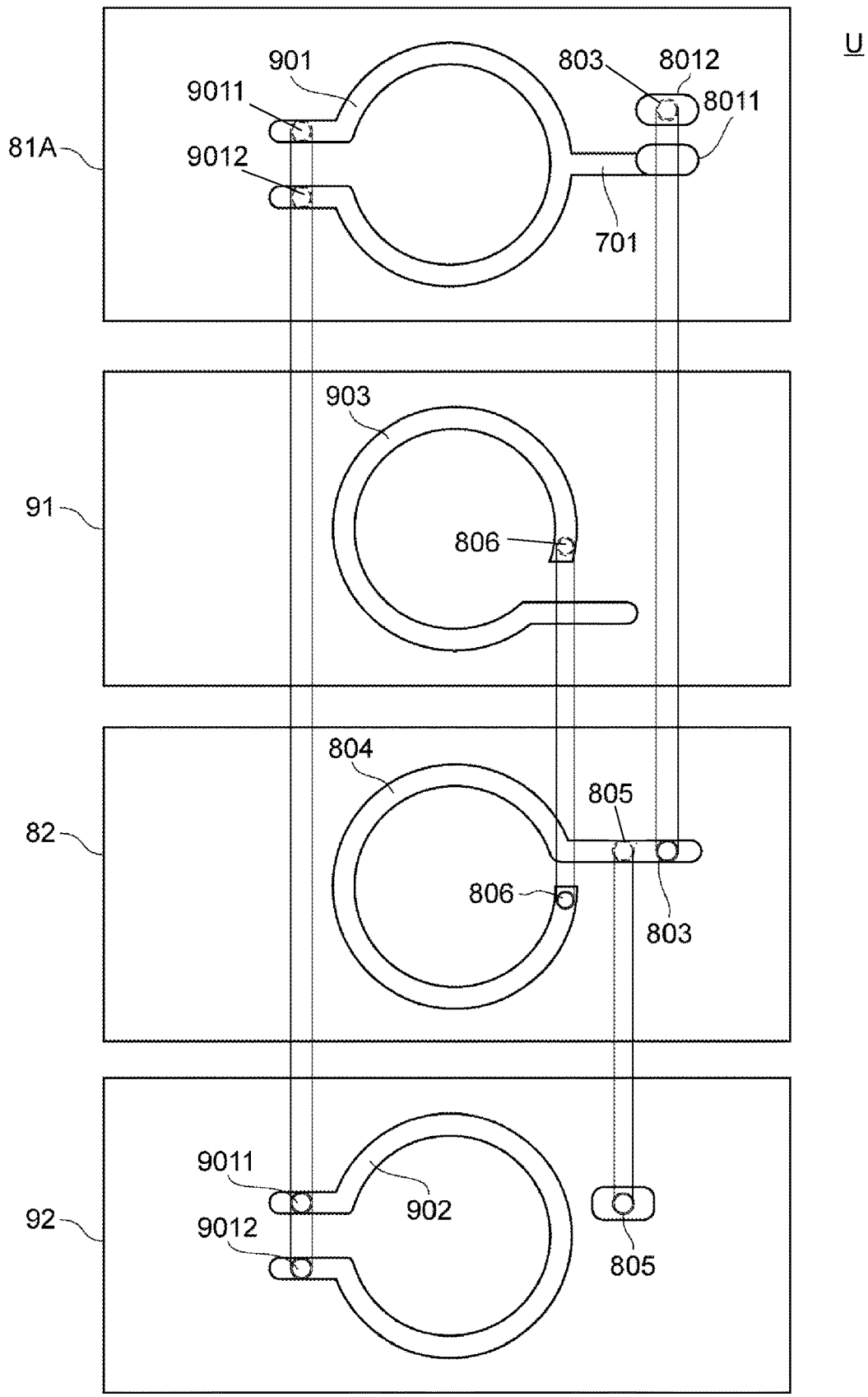
FIG. 9 is a diagram illustrating another layout of the transformer in the power amplifying circuit according to the third embodiment.

Other examples of the substrate U including the wiring layer 81 and the wiring layer 82 illustrated in FIG. 8 will be described by referring to FIGS. 9 to 12. FIG. 9 illustrates the substrate U in which, in the laminating direction of the substrate U, a wiring layer 81A (first wiring layer), a wiring layer 91, the wiring layer 82, and a wiring layer 92 are disposed in this sequence. FIGS. 9 to 12 illustrate four wiring layers. The number of wiring layers of the substrate U is not limited to this. Different wiring layers may be disposed.

In FIG. 9, a conductive portion 901 (first conductive portion), which is a part of the primary winding 1011, is disposed on the wiring layer 81A. The conductive portion 901 is disposed on the wiring layer 81A in a partial-circle shape. Like the primary winding 1011 in FIG. 8, the conductive portion 901 is connected to the line 701. The conductive portion 901 is connected to a conductive portion 902, which is disposed on the wiring layer 92, through vias 9011 and 9012 which are disposed in end portions.

The wiring layer 91 has a conductive portion 903 connected to the conductive portion 804 on the wiring layer 82 through the via 806. The conductive portion 903 is another part of the secondary winding 1012. The conductive portion 903 is disposed on the wiring layer 91 in a partial-circle shape. In plan view of the substrate U, the conductive portion 903 is disposed so as to overlap the conductive portion 901 partially. The conductive portion 903 is connected to the unbalanced line 106.

The wiring layer 92 has the conductive portion 902, which is another part of the primary winding 1011 and which is connected to the conductive portion 901 through the via 9011 and the via 9012. The conductive portion 902 is disposed on the wiring layer 92 in a partial-circle shape. The conductive portion 901 and the conductive portion 902 form the primary winding 1011. In the substrate U illustrated in FIG. 9, the via 805 in the wiring layer 82 is connected to the ground through the wiring layer 92.

Figure 10:
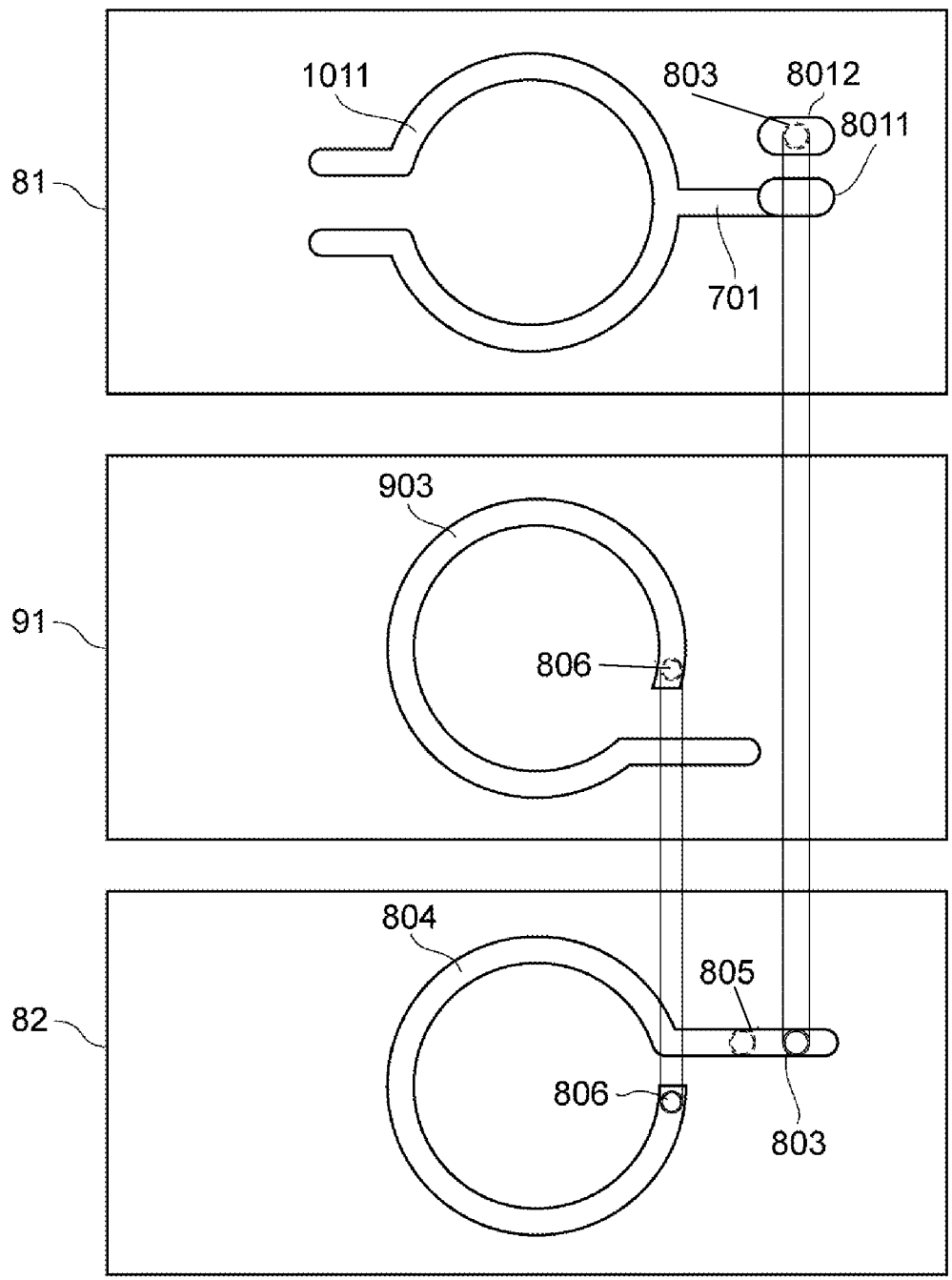
FIG. 10 is a diagram illustrating another layout of the transformer in the power amplifying circuit according to the third embodiment.

FIG. 10 illustrates another configuration example of the substrate U. As in FIG. 8, the primary winding 1011 is disposed on the wiring layer 81, and the wiring layer 91 is disposed between the wiring layer 81 and the wiring layer 82.

Figure 11:
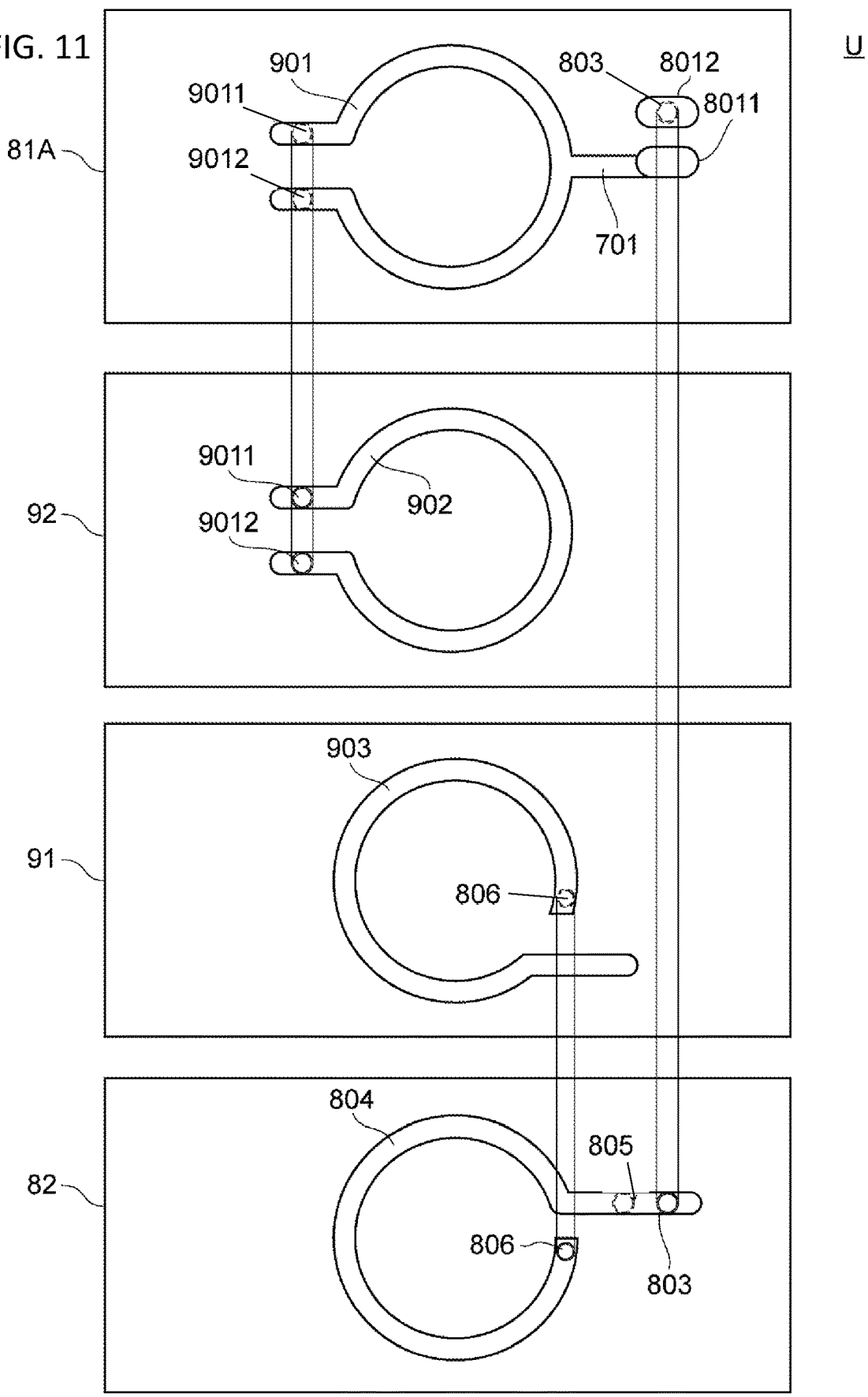
FIG. 11 is a diagram illustrating another layout of the transformer in the power amplifying circuit according to the third embodiment.

FIG. 11 illustrates another configuration example of the substrate U. In the substrate U in FIG. 11, in the laminating direction, the wiring layer 81A, the wiring layer 92, the wiring layer 91, and the wiring layer 82 are disposed in this sequence. In the same manner as that in FIG. 9, the wiring layer 81A is connected to the wiring layer 92, and the wiring layer 82 is connected to the wiring layer 91.

Figure 12:
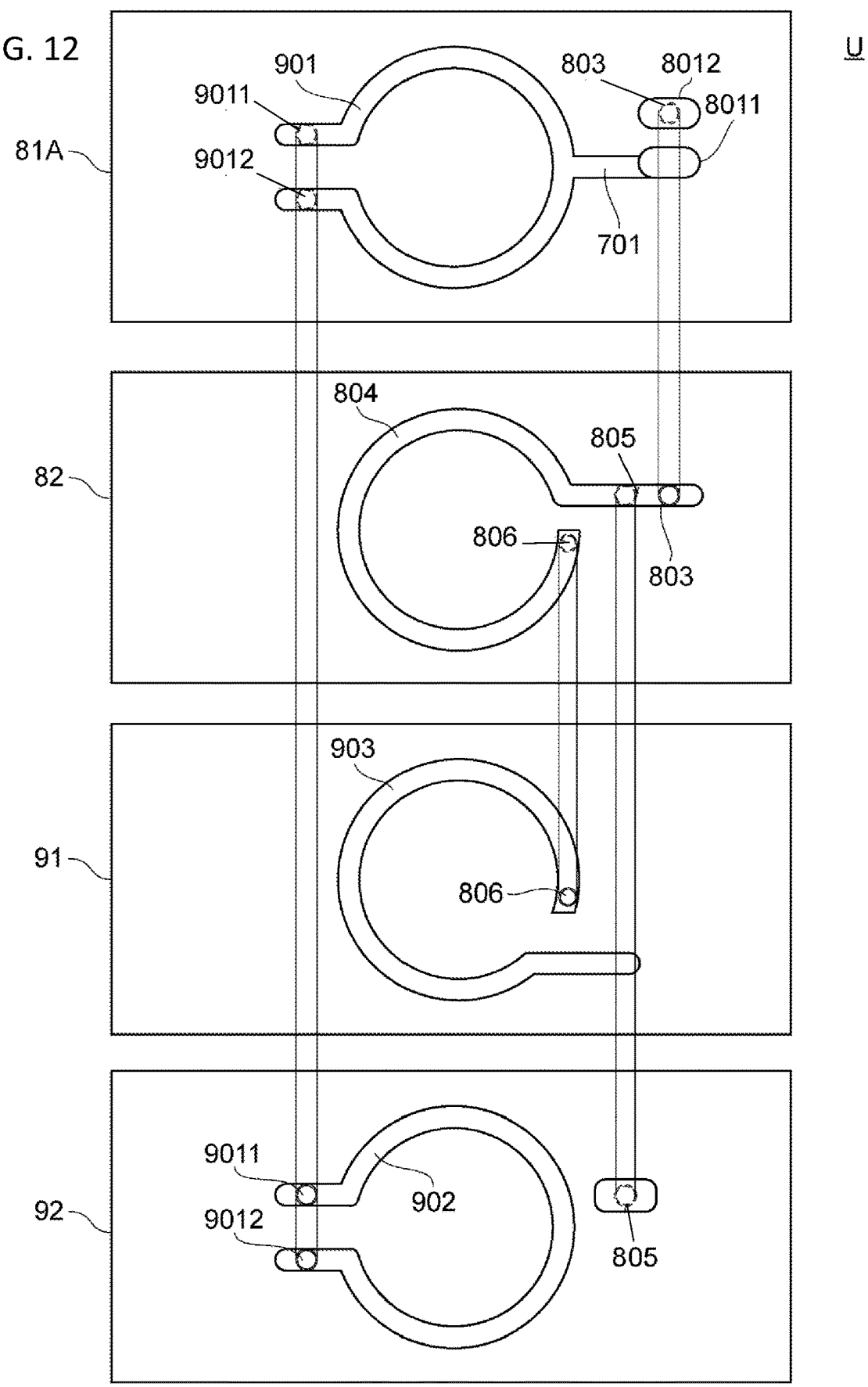
FIG. 12 is a diagram illustrating another layout of the transformer in the power amplifying circuit according to the third embodiment.

FIG. 12 illustrates another configuration example of the substrate U. In the substrate U in FIG. 12, in the laminating direction, the wiring layer 81A, the wiring layer 82, the wiring layer 91, and the wiring layer 92 are disposed in this sequence. In the same manner as that in FIG. 9, the wiring layer 81A is connected to the wiring layer 92, and the wiring layer 82 is connected to the wiring layer 91. In the example illustrated in FIG. 12, the via 805 in the wiring layer 82 is connected to the ground through the wiring layer 92.

Figure 13:
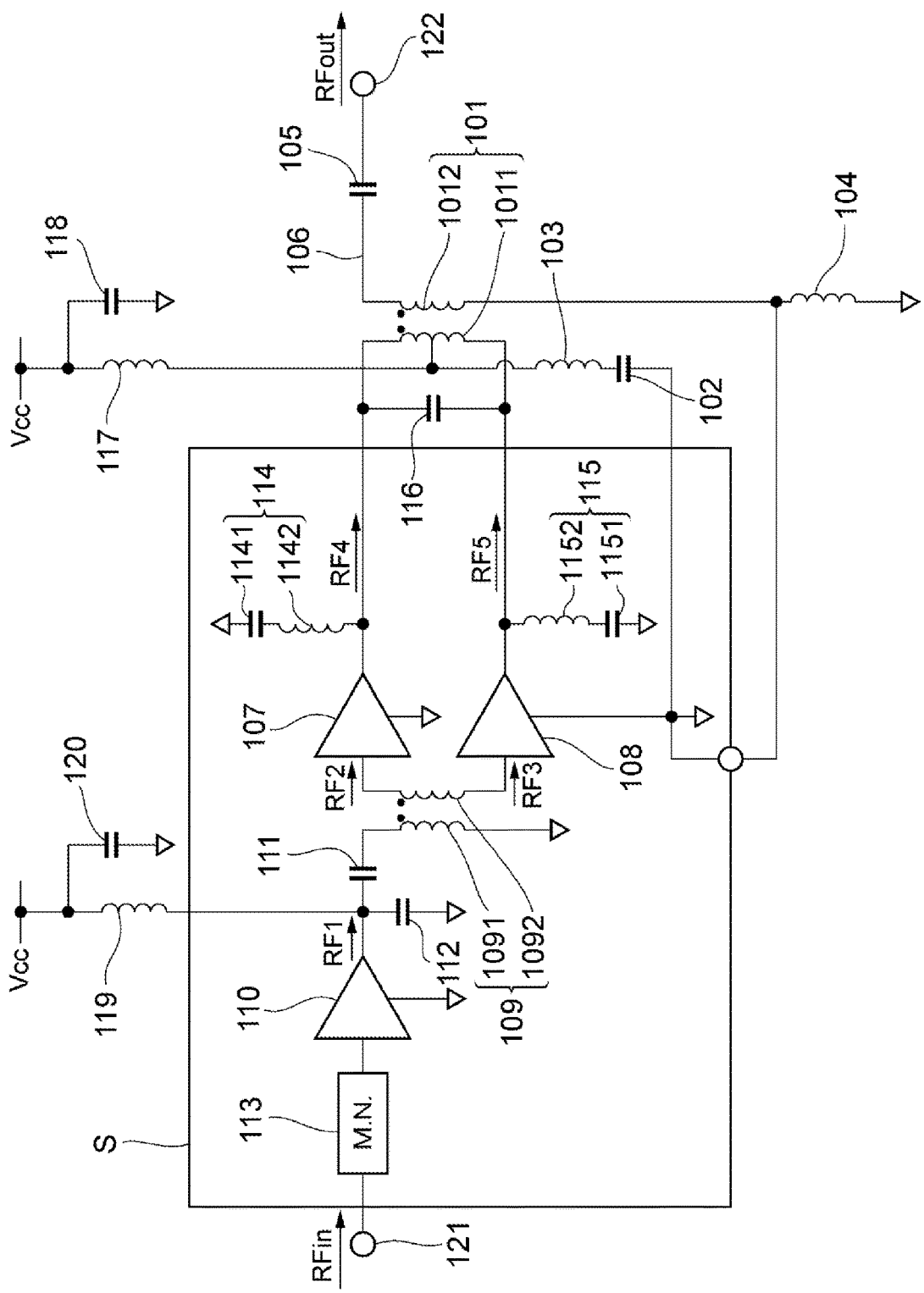
FIG. 13 is a circuit diagram illustrating a power amplifying circuit according to a fourth embodiment.

A fourth embodiment will be described. FIG. 13 is a circuit diagram illustrating a power amplifying circuit 10C according to the fourth embodiment. The power amplifying circuit 10C is different from the power amplifying circuit 10 in that the capacitor 102 is connected, at its second end, to the ground through the semiconductor substrate S. In the power amplifying circuit 10C, the capacitor 102 is connected, at its second end, for example, to the ground side of the amplifier 108, and is connected to the inductor 104 and the ground. Like the power amplifying circuit 10, the power amplifying circuit 10C may also reduce the imbalance between differential signals by adjusting the values of the inductor 103 and the capacitor 102.

Figure 14:
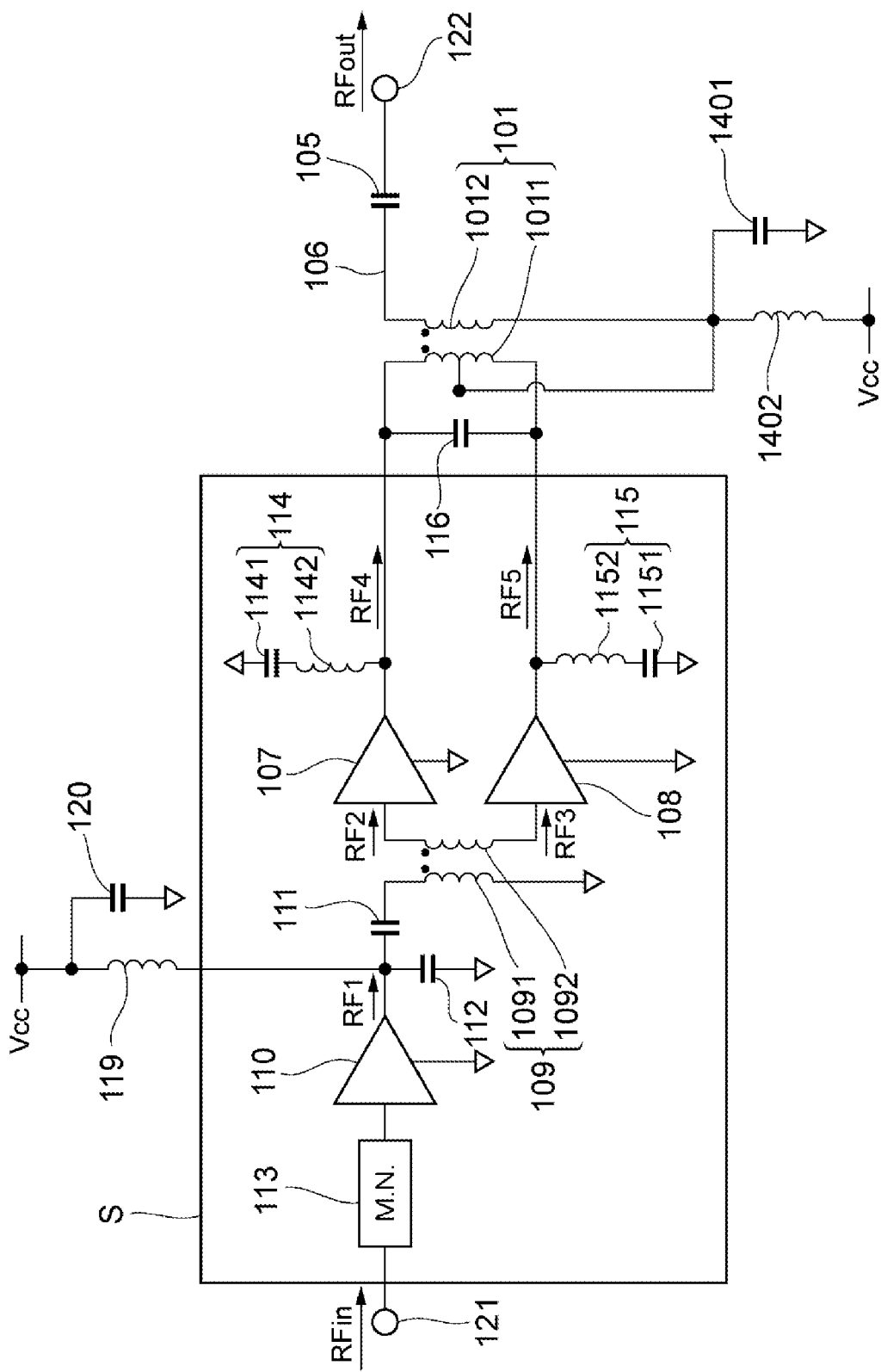
FIG. 14 is a circuit diagram illustrating a power amplifying circuit according to a fifth embodiment.

A fifth embodiment will be described. FIG. 14 is a circuit diagram illustrating a power amplifying circuit 10D according to the fifth embodiment. The power amplifying circuit 10D includes a capacitor 1401 and an inductor 1402. In the power amplifying circuit 10D, the midpoint of the primary winding 1011 is connected to the ground through the capacitor 1401. The midpoint of the primary winding 1011 is supplied with the power supply voltage Vcc through the inductor 1402.

In the power amplifying circuit 10D, the secondary winding 1012 is also supplied with the power supply voltage Vcc. However, since the capacitor 105 cuts the direct-current component, the influence on the output signals RFout is suppressed.

Compared with the power amplifying circuit 10, the power amplifying circuit 10D does not use the capacitor 118 used for AC grounding of the power supply voltage. Therefore, the number of circuit elements may be decreased. Like the power amplifying circuit 10, the power amplifying circuit 10D may also reduce the imbalance between differential signals.

Figure 15:
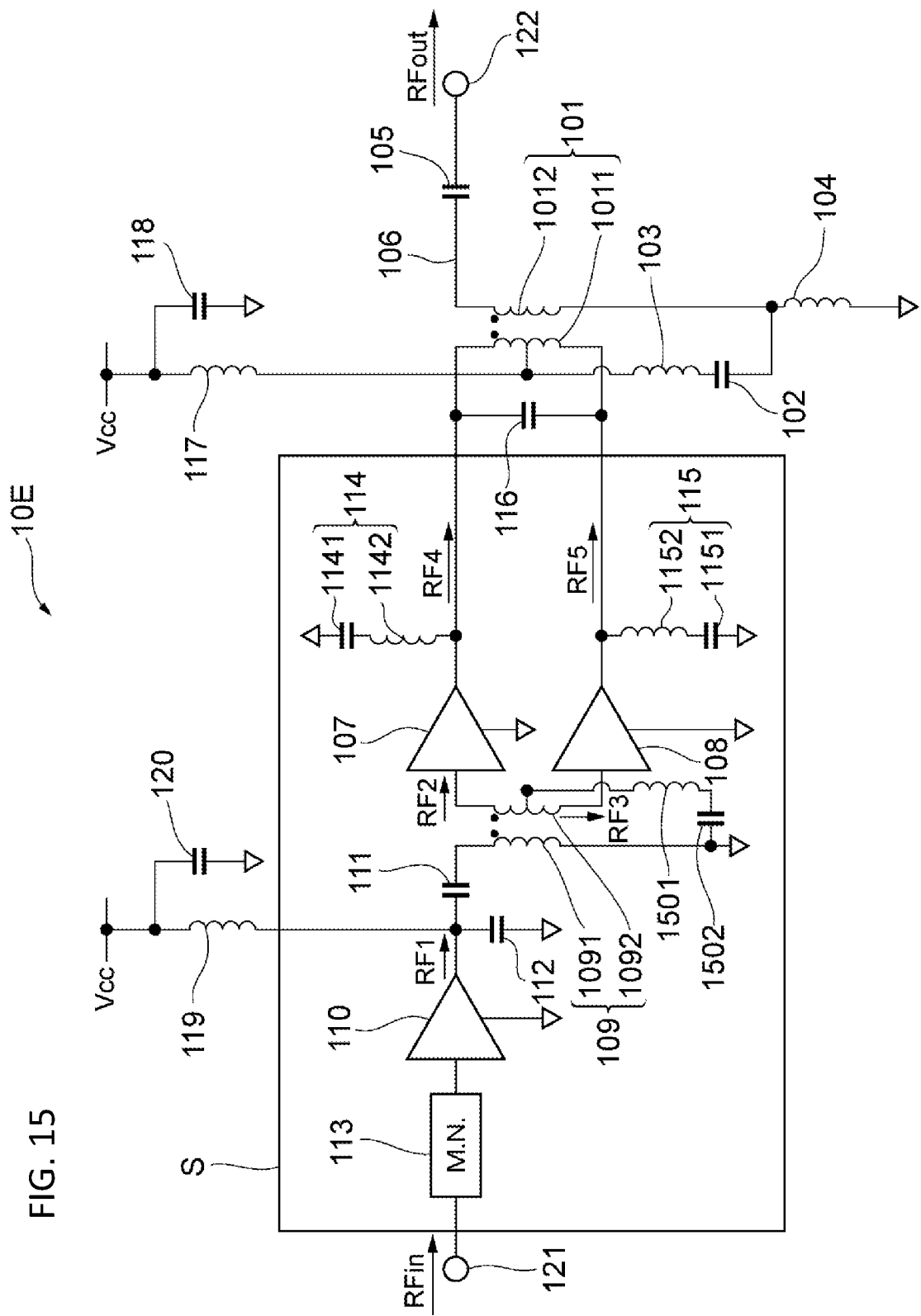
FIG. 15 is a circuit diagram illustrating a power amplifying circuit according to a sixth embodiment.

A sixth embodiment will be described. FIG. 15 is a circuit diagram illustrating a power amplifying circuit 10E according to the sixth embodiment.

The power amplifying circuit 10E has an inductor 1501 and a capacitor 1502. The inductor 1501 is connected, at its first end, to the midpoint of the secondary winding 1092 (first winding) of the transformer 109. The inductor 1501 is connected, at its second end, to a first end of the capacitor 1502. The capacitor 1502 is connected, at its second end, to the second end of the primary winding 1091 (second winding) and the ground.

In the power amplifying circuit 10E, substantially the same effect as that of the power amplifying circuit 10 may cause reduction of the imbalance between a signal RF2 and a signal RF3 which occurs in the unbalanced-balanced transform performed by the transformer 109. The power amplifying circuit 10E may balance the amplitudes and the phases of differential signals received by the amplifier 107 and the amplifier 108, respectively. Reduction of the imbalance between differential signals before amplification causes reduction of the imbalance between differential signals combined by the transformer 101.

Figure 16:
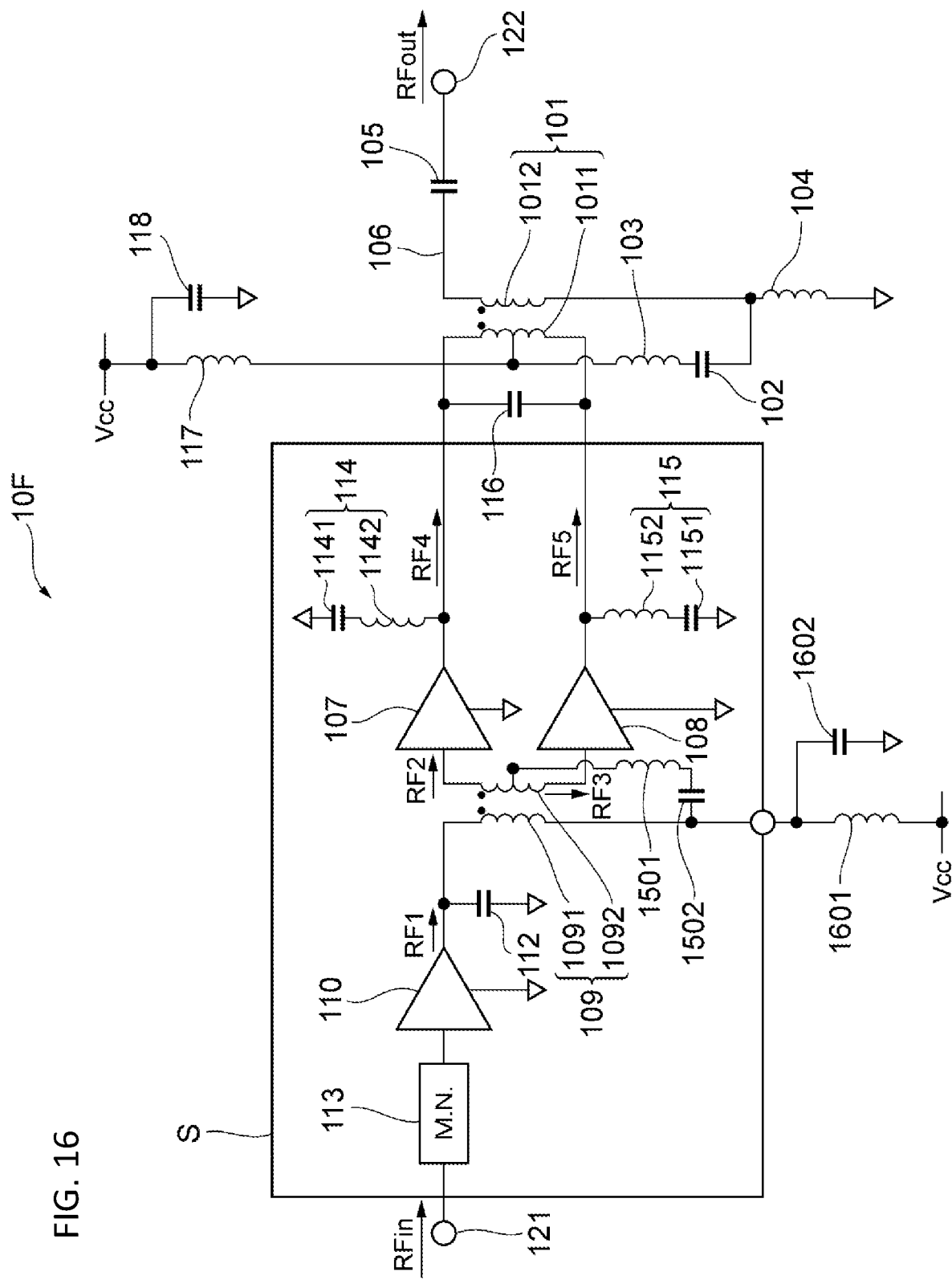
FIG. 16 is a circuit diagram illustrating a power amplifying circuit according to a seventh embodiment.

A seventh embodiment will be described. FIG. 16 is a circuit diagram illustrating a power amplifying circuit 10F according to the seventh embodiment. The power amplifying circuit 10F includes an inductor 1601 and a capacitor 1602. The power amplifying circuit 10F according to the seventh embodiment and a power amplifying circuit 10G in an eighth embodiment described below are different from the power amplifying circuit 10 in that the capacitor 111 is not disposed.

The inductor 1601 is connected, at its first end, to the second end of the primary winding 1091 and the second end of the capacitor 1502, and is supplied with the power supply voltage Vcc at its second end. The capacitor 1602 is connected, at its first end, to the second end of the primary winding 1091, and is connected, at its second end, to the ground. The amplifier 110 is supplied with the power supply voltage through the primary winding 1091 and the inductor 1601.

Compared with the power amplifying circuit 10E, the power amplifying circuit 10F does not use the capacitor 120 used for AC grounding of the power supply voltage. Therefore, the number of circuit elements may be decreased. The power amplifying circuit 10F may use the primary winding 1091 as an inductance element disposed between the amplifier 110 and the power supply, achieving a reduction in size of the circuit. Like the power amplifying circuit 10E, the power amplifying circuit 10F may also reduce the imbalance between differential signals.

Figure 17:
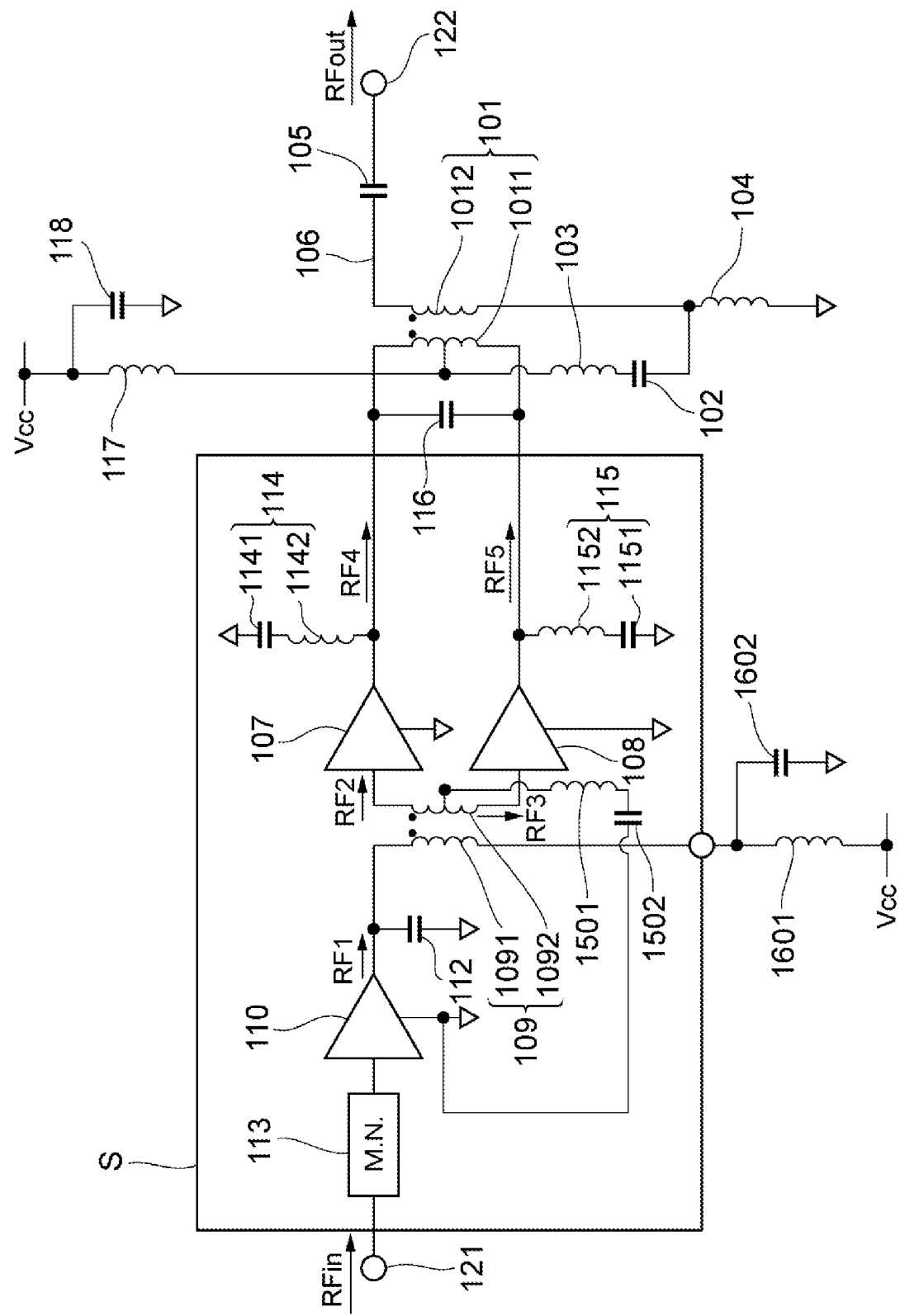
FIG. 17 is a circuit diagram illustrating a power amplifying circuit according to an eighth embodiment.

The eighth embodiment will be described. FIG. 17 is a circuit diagram illustrating a power amplifying circuit 10G according to the eighth embodiment. The power amplifying circuit 10G is different from the power amplifying circuit 10E in that the capacitor 1502 is connected, at its second end, to a terminal through which the amplifier 110 is connected to the ground. In other words, in the power amplifying circuit 10G, the capacitor 1502 is connected, at its second end, to the ground for the semiconductor substrate S through the ground side of the amplifier 110. In the power amplifying circuit 10G, the amplifier 110 is connected to the terminal connected to the ground. Like the power amplifying circuit 10E, the power amplifying circuit 10G may also reduce the imbalance between differential signals by adjusting the values of the inductor 1501 and the capacitor 1502.

In the power amplifying circuits 10E, 10F, and 10G, the transformer 101, which combines amplified differential signals, may be connected, for example, in the same manner as that in the power amplifying circuit 1800. That is, the transformer, which combines power, may be connected in a manner other than that in the example illustrated in the power amplifying circuit 10.

The exemplary embodiments of the present disclosure are described above. The power amplifying circuits 10 and 10A include the amplifier 107, the amplifier 108, the transformer 101 having the primary winding 1011 and the secondary winding 1012, and the capacitor 102. The amplifier 107 amplifies a signal RF2 which is one of differential signals. The amplifier 108 amplifies a signal RF3 which is the other of differential signals. The primary winding 1011 is connected, at its first end, to the amplifier 107, and is connected, at its second end, to the amplifier 108. The secondary winding 1012 is connected, at its first end, to the unbalanced line 106, through which an unbalanced signal is transmitted, and is connected, at its second end, to the ground. The secondary winding 1012 is electromagnetically coupled to the primary winding 1011. The capacitor 102 is connected, at its first end, to the midpoint of the primary winding 1011, and is connected, at its second end, to the ground.

In the power amplifying circuits 10 and 10A, the midpoint of the primary winding 1011 is AC grounded through the capacitor 102. Thus, the capacitance value of the capacitor 102 may be adjusted so that the impedance, which is seen from the output of the amplifier 107 and the output of the amplifier 108 to the midpoint of the primary winding 1011, is seen as being short-circuited for the fundamental frequency of an input signal RFin. The power amplifying circuit 10 may reduce the imbalance between differential signals which occurs in the transformer 101. Reduction of the imbalance may cause the efficiency of the power amplification of the power amplifying circuit 10 to be improved.

The power amplifying circuit 10E includes the amplifier 107, the amplifier 108, the transformer 109 having the secondary winding 1092 and the primary winding 1091, and the capacitor 1502. The amplifier 107 amplifies a signal RF2 which is one of differential signals. The amplifier 108 amplifies a signal RF3 which is the other of differential signals. The secondary winding 1092 is connected, at its first end, to the amplifier 107, and is connected, at its second end, to the amplifier 108. The primary winding 1091 is connected, at its first end, to the unbalanced line, through which an unbalanced signal is transmitted, and is connected, at its second end, to the ground. The primary winding 1091 is electromagnetically coupled to the secondary winding 1092. The capacitor 1502 is connected, at its first end, to the midpoint of the secondary winding 1092, and is connected, at its second end, to the ground.

In the power amplifying circuit 10E, substantially the same effect as that in the power amplifying circuit 10 may cause reduction of the imbalance between a signal RF2 and a signal RF3 which occurs in the transformer 109. The power amplifying circuit 10E may balance the amplitudes and the phases of differential signals received by the amplifier 107 and the amplifier 108, respectively. Reduction of the imbalance between differential signals before amplification may cause reduction of the imbalance between differential signals combined by the transformer 101. Reduction of the imbalance may cause the efficiency of the power amplification of the power amplifying circuit 10E to be improved.

In the power amplifying circuit 10, the capacitor 102 is connected, at its second end, to the second end of the secondary winding 1012. The capacitor 102, which is thus connected to the ground, may cause appropriate reduction of the imbalance between differential signals which occurs in the transformer 101.

In the power amplifying circuit 10C, the capacitor 102 is connected, at its second end, to the ground through the semiconductor substrate S having the amplifier 107 and the amplifier 108. Thus, the capacitor 102, which is thus connected to the ground, may cause appropriate reduction of the imbalance between differential signals which occurs in the transformer 101.

The power amplifying circuit 10 further includes the inductor 103, which is connected, at its first end, to the midpoint of the primary winding 1011 and which is connected, at its second end, to the first end of the capacitor 102. The capacitor 102 is connected to the midpoint of the primary winding 1011 through the inductor 103. The inductor 103 thus disposed causes more appropriate adjustment of the impedance seen from the amplifier 107 and the amplifier 108 to the midpoint of the primary winding 1011. This enables reduction of the imbalance over a wider frequency range of an input signal RFin than that in the case in which only a capacitor is used.

In the power amplifying circuit 10B, the inductor 103 is formed of a wire on the substrate U having the inductor 103. This enables a reduction of the number of circuit elements.

In the power amplifying circuit 10B, the substrate U is a multilayer body obtained by laminating wiring layers including the wiring layer 81 or 81A and the wiring layer 82. On the wiring layer 81 or 81A, the primary winding 1011 or the conductive portion 901, the capacitor 102, and the inductor 103 are disposed. On the wiring layer 82, the conductive portion 804, which is a part of the secondary winding 1012 including the second end of the secondary winding 1012, is connected to the second end of the capacitor 102 and the ground. In plan view of the substrate U, the conductive portion 804 overlaps the primary winding 1011 or the conductive portion 901 partially. The wiring layer 82 is opposite the wiring layer 81. Thus, the power amplifying circuit 10B is achieved.

In the power amplifying circuit 10D, the capacitor 1401 is connected, at its first end, to the power supply which supplies the power supply voltage Vcc to the amplifier 107 and the amplifier 108. This achieves a reduction of the number of circuit elements.

The power amplifying circuit 10F includes the amplifier 110 whose output is connected to the first end of the primary winding 1091. The capacitor 1502 is connected, at its second end, to the power supply which supplies the power supply voltage Vcc to the amplifier 110. This achieves a reduction of the number of circuit elements.

In the power amplifying circuit 10G, the capacitor 1502 is connected, at its second end, to the terminal through which the amplifier 110 is connected to the ground. This also causes reduction of the imbalance between differential signals before amplification, achieving reduction of the imbalance between differential signals combined by the transformer 101.

The power amplifying circuits 10E, 10F, and 10G further include the inductor 1501, which is connected, at its first end, to the midpoint of the secondary winding 1092 and which is connected, at its second end, to the first end of the capacitor 1502. The capacitor 1502 is connected to the midpoint of the secondary winding 1092 through the inductor 1501. Like the power amplifying circuit 10, this also enables reduction of the imbalance over a wider frequency range.

The embodiments described above are made to facilitate the understanding of the present disclosure, not for limited interpretation of the present disclosure. The present disclosure may be changed/improved without departing from the gist of the present disclosure. In addition, the present disclosure encompasses its equivalent. That is, embodiments, which are obtained by those skilled in the art changing the above-described embodiments in design appropriately, are also encompassed in the scope of the present disclosure as long as such embodiments have the characteristics of the present disclosure. For example, the components included in the embodiments, and their arrangement, materials, conditions, shapes, sizes, and the like are not limited to those described above, and may be changed appropriately. The embodiments are exemplary. Needless to say, partial replacement or combination of the configurations in different embodiments may be made. These are encompassed in the scope of the present disclosure as long as they have the characteristics of the present disclosure. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifying circuit comprising:
   a first amplifier that amplifies a first signal of differential signals;
   a second amplifier that amplifies a second signal of the differential signals;
   a transformer that has a first winding and a second winding, the first winding having a first end connected to the first amplifier and a second end connected to the second amplifier, the second winding having a first end connected to an unbalanced line through which an unbalanced signal is transmitted and a second end connected to a ground, the second winding being electromagnetically coupled to the first winding; and
   a capacitance element that has a first end connected to a midpoint of the first winding and a second end connected to the ground via a second inductance element,
   wherein the second end of the capacitance element is connected to the second end of the second winding.

2. The power amplifying circuit according to claim 1,
   wherein the first end of the first winding is connected to an output of the first amplifier, and
   wherein the second end of the first winding is connected to an output of the second amplifier.

3. The power amplifying circuit according to claim 2, further comprising:
   a first inductance element that has a first end connected to the midpoint of the first winding and a second end connected to the first end of the capacitance element,
   wherein the capacitance element is connected to the midpoint of the first winding through the first inductance element.

4. The power amplifying circuit according to claim 3, wherein the first inductance element comprises a wire on a substrate.

5. The power amplifying circuit according to claim 2, wherein the first end of the capacitance element is connected to a power supply supplying a power supply voltage to the first amplifier and the second amplifier.

6. The power amplifying circuit according to claim 2, further comprising:
   a line that has a first end connected to the midpoint of the first winding and a second end connected to the first end of the capacitance element,
   wherein the capacitance element is connected to the midpoint of the first winding through the line.

* * * * *